(12) United States Patent
Knudsen et al.

(10) Patent No.: US 8,779,564 B1
(45) Date of Patent: Jul. 15, 2014

(54) SEMICONDUCTOR DEVICE WITH CAPACITIVE COUPLING STRUCTURE

(71) Applicant: Intel IP Corporation, Santa Clara, CA (US)

(72) Inventors: Mikael Knudsen, Gistrup (DK); Thorsten Meyer, Regensburg (DE); Saravana Maruthamuthu, Munich (DE); Andreas Wolter, Regensburg (DE); Georg Seidemann, Landshut (DE); Pablo Herrero, Munich (DE); Pauli Jaervinen, Wallerfing (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 13/803,143

(22) Filed: Mar. 14, 2013

(51) Int. Cl.
*H01L 23/552* (2006.01)
*H01L 27/06* (2006.01)

(52) U.S. Cl.
CPC ..................................... *H01L 27/06* (2013.01)
USPC ......................................................... 257/660

(58) Field of Classification Search
CPC .............................. H01L 27/06; H01L 28/40
USPC .......................................... 257/690, 724, 660
See application file for complete search history.

(56) References Cited

U.S. PATENT DOCUMENTS

| | | | |
|---|---|---|---|
| 8,039,303 B2 * | 10/2011 | Shim et al. ..................... | 438/107 |
| 8,170,510 B2 | 5/2012 | Knudsen et al. | |
| 2010/0302106 A1 | 12/2010 | Knudsen et al. | |
| 2010/0302123 A1 | 12/2010 | Knudsen et al. | |
| 2011/0117862 A1 | 5/2011 | Bagger et al. | |
| 2012/0062270 A1 * | 3/2012 | Rathburn ................. | 324/762.05 |
| 2012/0062439 A1 * | 3/2012 | Liao et al. ...................... | 343/841 |
| 2012/0168963 A1 * | 7/2012 | Huang et al. .................. | 257/774 |
| 2012/0199972 A1 * | 8/2012 | Pagaila et al. ................. | 257/737 |
| 2012/0223426 A9 * | 9/2012 | Shim et al. ..................... | 257/737 |
| 2012/0292738 A1 * | 11/2012 | Lin et al. ....................... | 257/531 |
| 2012/0319304 A1 * | 12/2012 | Pressel et al. ................. | 257/787 |
| 2013/0078915 A1 * | 3/2013 | Zhao et al. .................... | 455/41.1 |
| 2013/0207247 A1 * | 8/2013 | Pagaila et al. ................. | 257/659 |
| 2013/0277803 A1 * | 10/2013 | Pagani .......................... | 257/532 |
| 2013/0328739 A1 * | 12/2013 | Rofougaran et al. ......... | 343/777 |

FOREIGN PATENT DOCUMENTS

| | | |
|---|---|---|
| DE | 102010029258 A1 | 12/2010 |
| DE | 102010029265 A1 | 12/2010 |
| DE | 102010029314 A1 | 1/2011 |

OTHER PUBLICATIONS

R. C. Hansen, Fundamental limitations in Antennas, Proc. IEEE, Feb. 1981, vol. 69, No. 2.
M. Wojnowski, R. Lachner, J. Boeck, C. Wagner, F. Starzer, G. Sommer, K. Pressel, R. Weigel, Embedded Wafer Level Ball Grid Array (eWLB) Technology for Millimeter-Wave Applications, 2011 13th Electronics Packaging Technology Conference, 2011, pp. 423-429.

* cited by examiner

*Primary Examiner* — Nathan Ha

(57) ABSTRACT

A semiconductor device may include: a chip; a chip packaging structure at least partially surrounding the chip and having a receiving region configured to receive a first capacitive coupling structure; a first capacitive coupling structure disposed in the receiving region; and a second capacitive coupling structure disposed over the first capacitive coupling structure and capacitively coupled to the first capacitive coupling structure.

26 Claims, 20 Drawing Sheets

SEMICONDUCTOR DEVICE WITH CAPACITIVE COUPLING STRUCTURE

TECHNICAL FIELD

Various aspects relate to semiconductor devices.

BACKGROUND

An antenna may be designed according to a bandwidth criterion, a size criterion and/or an efficiency criterion. The design criteria for the antenna may, for example, be interrelated. For example, a particular size of the antenna may place a limit on a maximum bandwidth and/or efficiency that may be achieved by the antenna.

Even if an antenna may be designed to satisfy a particular criterion, there may be factors that may, for example, negatively affect a performance of the antenna. For example, an antenna may be designed to satisfy an efficiency criterion. However, resistive and/or dielectric losses may occur in the antenna and/or in a component connected (e.g. electrically and/or capacitively connected) to the antenna, thus reducing the efficiency of the antenna. Accordingly, the antenna may not achieve the efficiency criterion it was designed for. It may be desirable to minimize resistive and/or dielectric losses in an antenna, and consequently improve the efficiency of the antenna.

SUMMARY

A semiconductor device is provided, which may include: a chip; a chip packaging structure at least partially surrounding the chip and having a receiving region configured to receive a first capacitive coupling structure; a first capacitive coupling structure disposed in the receiving region; and a second capacitive coupling structure disposed over the first capacitive coupling structure and capacitively coupled to the first capacitive coupling structure.

Furthermore, a semiconductor device is provided, which may include: a chip; a first capacitive coupling structure disposed over the chip and electrically coupled to the chip; a chip packaging structure at least partially surrounding the chip and the first capacitive coupling structure; and a second capacitive coupling structure disposed outside the chip packaging structure and capacitively coupled to the first capacitive coupling structure.

Furthermore, a semiconductor device is provided, which may include: a first chip; a first chip packaging structure at least partially surrounding the first chip and having a first receiving region configured to receive a first antenna coupling element; a first antenna coupling element disposed in the first receiving region; a first antenna disposed over the first antenna coupling element and capacitively coupled to the first antenna coupling element; a second chip; a second chip packaging structure at least partially surrounding the second chip and having a second receiving region configured to receive a second antenna coupling element; a second antenna coupling element disposed in the second receiving region; a second antenna disposed over the second antenna coupling element and capacitively coupled to the second antenna coupling element; and a third chip electrically coupled to the first chip and the second chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1:
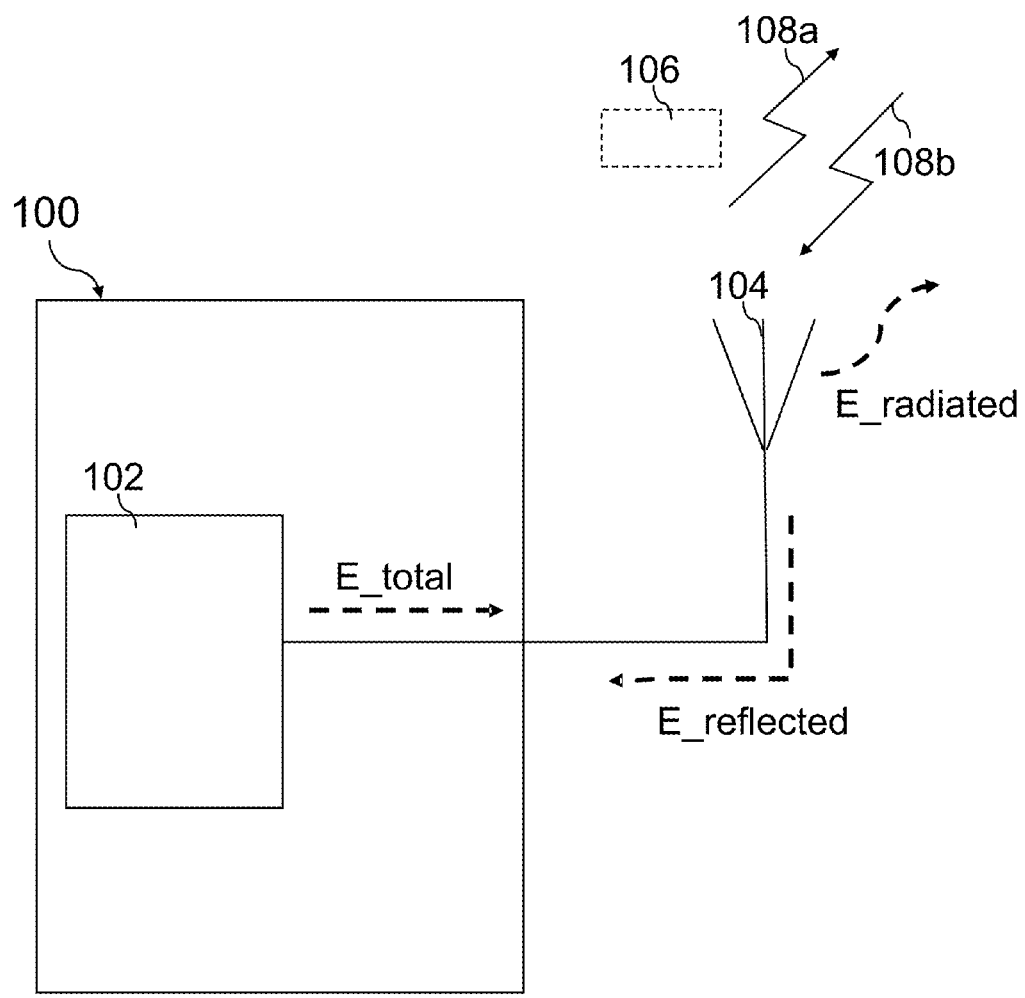
FIG. 1 shows a communications device including a chip and an antenna.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described for structures or devices, and various aspects are described for methods. It may be understood that one or more (e.g. all) aspects described in connection with structures or devices may be equally applicable to the methods, and vice versa.

The word "exemplary" is used herein to mean "serving as an example, instance, or illustration". Any aspect or design described herein as "exemplary" is not necessarily to be construed as preferred or advantageous over other aspects or designs.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The terms "coupled" and/or "electrically coupled" and/or "connected" and/or "electrically connected", used herein to describe a feature being connected to at least one other implied feature, are not meant to mean that the feature and the at least one other implied feature must be directly coupled or connected together; intervening features may be provided between the feature and at least one other implied feature.

Directional terminology, such as e.g. "upper", "lower", "top", "bottom", "left-hand", "right-hand", etc., may be used with reference to the orientation of figure(s) being described. Because components of the figure(s) may be positioned in a number of different orientations, the directional terminology is used for purposes of illustration and is in no way limiting. It is to be understood that structural or logical changes may be made without departing from the scope of the invention.

FIG. 1 shows a communications device 100 including a chip 102 and an antenna 104.

The communications device 100 may include, or may be, at least one of a wireless communications device, a telephone (e.g. a mobile phone), a hand-held computing device (e.g. a personal digital assistant (PDA)), a media playing device, a portable gaming device, a personal computer, and a laptop computer, although other communications devices may be possible as well.

The communications device 100 (e.g. a wireless communications device) may include the antenna 104 (e.g. at least one antenna), which may be configured to transmit and/or receive a signal 106 (e.g. a wireless signal). In FIG. 1, the transmission of the signal 106 may be indicated by the arrow 108a, and the reception of the signal 106 may be indicated by the arrow 108b.

The signal 106 (e.g. transmitted and/or received on the antenna 104) may include, or may be, at least one of voice data, video data, audio data, multi-media data, control information, although other signals may be possible as well.

The transmission and/or reception of the signal 106 on the antenna 104 may, for example, be controlled by the chip 102 that may be coupled (e.g. electrically coupled) to the antenna 104, e.g. via an electrically conductive connection between the antenna 104 and the chip 102.

The chip 102 may include a transceiver and an amplifier (e.g. a power amplifier). Optionally, the chip 102 may additionally include a tuner (e.g. an antenna tuner). The transceiver may be configured to control a transmission and/or a reception of the signal 106 on the antenna 104. For example, the transceiver may include, or may be, at least one of a tri-band universal mobile telecommunications system (UMTS) transceiver, a quad-band global system for mobile communications (GSM) transceiver, a wireless local area network (WLAN) transceiver, a global positioning system (GPS) transceiver, and a digital video broadcasting-handheld (DVB-H) transceiver, although other types of transceivers may be possible as well. The tuner (e.g. antenna tuner) may be configured to tune into a frequency or frequency band over which the signal 106 may be transmitted and/or received. The amplifier (e.g. power amplifier) may be configured to change (e.g. amplify and/or attenuate) a power of the signal 106, for example, in order to meet transmission and/or reception requirements.

A design parameter of the antenna 104 may include, or may be, a frequency or frequency band over which the signal 106 may be transmitted and/or received on the antenna 104. For example, the antenna 104 may be designed to maximize the number of frequencies and/or frequency bands that may be used to transmit and/or receive the signal 106. The number of frequencies or frequency bands used may also be referred to as "a bandwidth of the antenna 104". Accordingly, a design parameter of the antenna 104 may be a maximization of the bandwidth of the antenna 104.

A design parameter of the antenna of 104 the communications device 100 may include, or may be, an efficiency of the antenna 104. The efficiency of the antenna 104 may, for example, be a measure of how much energy of the signal 106 provided to the antenna 104 is transmitted (e.g. radiated) by the antenna 104. For example, as shown in FIG. 1, the energy of the signal 106 provided (e.g. by the chip 102) to the antenna 104 may be denoted as E_total. At least a part of the energy E_total may be transmitted (e.g. radiated) by the antenna 104. This may be indicated in FIG. 1 as E_radiated. At least a part of the energy E_total may be reflected (e.g. back to the chip 102) by the antenna 104. This may be indicated in FIG. 1 as E_reflected. For example, at least a part of the energy E_total may be reflected (e.g. back to the chip 102) by the antenna 104 in case the antenna 104 is blocked (e.g. by an object, e.g. a user of the communications device 100, e.g. a hand of the user of the communications device 100). By way of another example, a material of the communications device 100 and/or a component of the communications device 100 may, for example, cause the antenna 104 to shift in frequency, which may, for example, cause a reflection of at least a part of the energy E_total of the signal 106 back to the chip 102.

Energy that may not be reflected and/or transmitted (e.g. radiated) may be absorbed by the antenna 104 (e.g. a material of the antenna 104) and/or one or more other parts or components of the communications device 100 (e.g. a material of the one or more other parts or components of the communications device 100). The energy absorbed is not indicated in FIG. 1. An efficiency of the antenna 104 may, for example, be quantified by a ratio of E_radiated to E_total (e.g. E_radiated: E_total), e.g. expressed as a percentage. In other words, efficiency of the antenna 104 may, for example, be determined as the fraction E_radiated/E_total, e.g. expressed as a percentage. Accordingly, a design parameter of the antenna 104 may be a maximization of the efficiency of the antenna 104. This may be analogous to a minimization of losses (e.g. energy losses) in the antenna 104 (e.g. in a material of the antenna 104) and/or in one or more other parts or components of the communications device 100 (e.g. in a material of the one or more other parts or components of the communications device 100).

An efficiency of 100% may require a use of lossless materials (namely materials that do not produce loss (e.g. energy loss)) in the communications device 100. This may not be achievable. However a judicious choice of materials used for the communications device 100 and/or for the components of the communications device 100 may reduce loss (e.g. energy loss). For example, a judicious choice of materials used in components of the communications device 100 that may be close to the antenna 104 may reduce loss (e.g. energy loss). Such components may include, but are not limited to, an electrical connection with the antenna 104, a material of an antenna plate, a material of a chassis of the communications device 100, a material of a paint, a material of a battery, a material of a speaker, a material of a PCB, a material of deco parts, and a material of a hinge.

A design parameter of the antenna 104 of the communications device 100 may include, or may be, a size of the antenna 104. The size of the antenna 104 may, for example, include, or may be, a dimension of the antenna 104, for example a length and/or a width and/or a thickness of the antenna 104. For example, a design parameter of the antenna 104 may be a minimization in size of the antenna 104.

The size of the antenna 104 may, for example, be related to the bandwidth and/or the efficiency of the antenna 104. For example, an antenna 104 having a larger size (e.g. a larger length and/or width) may, for example, be configured to transmit and/or receive the signal 106 over a wider range of frequencies or frequency bands. In other words, a larger antenna 104 (e.g. having a larger length and/or width) may have a larger bandwidth.

By way of another example, an antenna 104 having a larger size (e.g. a larger length and/or width) may, for example, be configured to be more efficient in transmitting (e.g. radiating) the energy E_total of the signal 106 provided (e.g. by the transceiver 102) to the antenna 104. In other words, an antenna 104 having a larger size may, for example, have a larger efficiency.

By way of yet another example, the size of the antenna 104 may be based on a tradeoff between the efficiency and the bandwidth of the antenna 104. For example, a particular size of the antenna 104 may place a limit on a maximum bandwidth and/or efficiency that may be achieved by the antenna 104.

Accordingly, a design of the antenna 104 may depend on at least a size of the antenna 104 and a material of the communications device 100 and/or of the components of the communications device 100.

The use of one or more integrated antennas in modern communications systems (e.g. radio communications networks) has made the design of the antenna 104 more difficult. For example, an integrated antenna may be manufactured from a metal (e.g. low cost metal) that may induce loss (e.g. energy loss) in the signal 106, thus decreasing the efficiency of the antenna 104. By way of another example, an integrated antenna may be required to be small in size, thus decreasing the efficiency and the bandwidth of the antenna 104. This is exacerbated by the ever increasing demand for higher data rates and/or higher bandwidth (e.g. in multimedia applications).

A tunable antenna may be used to overcome the limitation of obtaining a large bandwidth for an antenna 104 having a small size. The tunable antenna may have a smaller instantaneous bandwidth. However, the tunable antenna may be able to tune to a plurality of frequencies. In other words, the tunable antenna may be able to shift its frequency of operation. Accordingly, the tunable antenna may be able to cover a wide number of frequencies or frequency bands via tuning, thus increasing the bandwidth of the antenna 104.

For example, the Smart Antenna Front End (SAFE) Project proposes tuning an antenna 104 having a narrowband in order to cover all frequencies or frequency bands required by, for example, a radio communications network (e.g. a UMTS network). The antenna 104 having a narrowband may have a high Q factor (quality factor). Furthermore tuning of the narrowband antenna 104 may be performed using tunable circuit elements having a high Q factor. The high-Q nature of the narrowband antenna 104 and/or high-Q tunable circuit elements may provide filtering, which may make it possible to reduce RF (radio-frequency) filtering requirements.

Figure 2A:
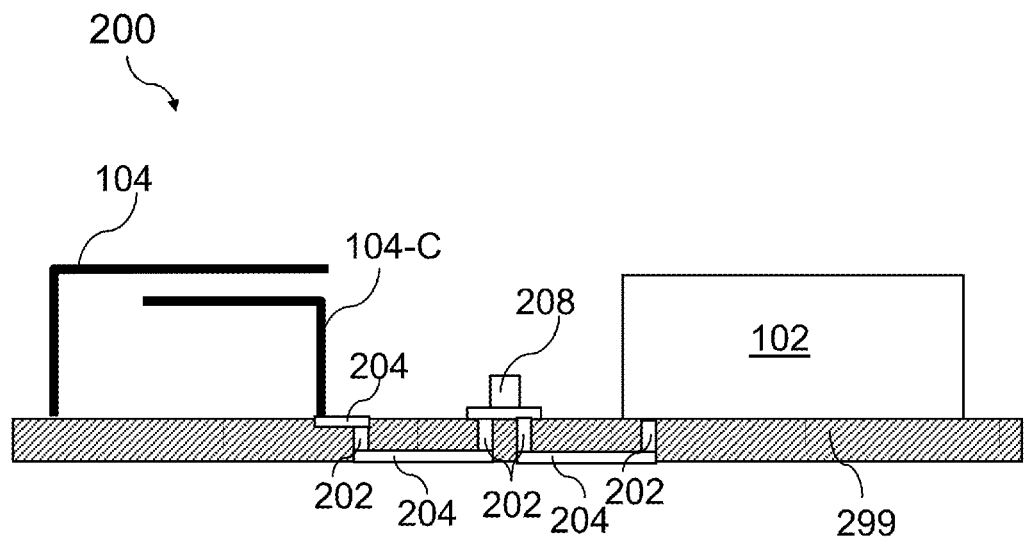
FIG. 2A to FIG. 2C show various arrangements including a chip, an antenna, and electrical connections that may electrically couple the chip and the antenna to each other.
Figure 2B:
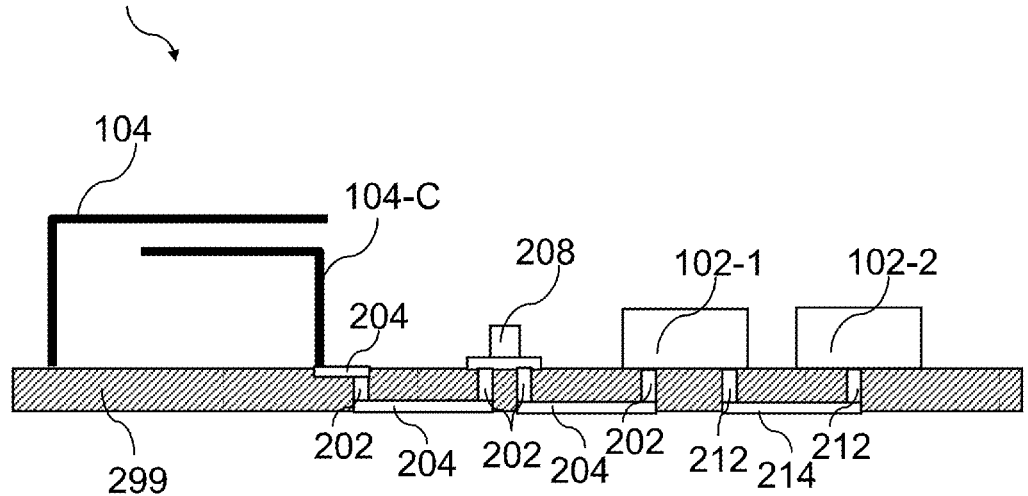
Figure 2C:
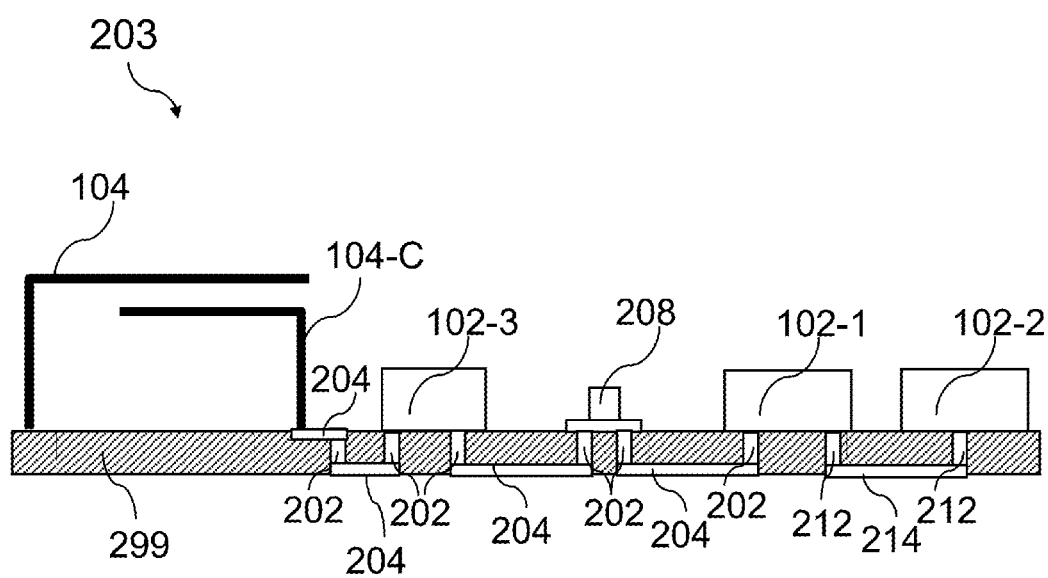

FIG. 2A to FIG. 2C show various arrangements including the chip 102, the antenna 104, and electrical connections that may electrically couple the chip 102 and the antenna 104 to each other.

The antenna 104 shown in FIG. 2A to FIG. 2C may include, or may be, a tunable antenna. The antenna 104 shown in FIG. 2A to FIG. 2C may include, or may be, an antenna having a narrowband and/or a high Q factor.

As shown in FIG. 2A, the arrangement 200 may include a carrier 299 (e.g. a printed circuit board (PCB)). The chip 102 and the antenna 104 may be attached to the carrier 299 (e.g. PCB), for example by means of at least one interconnect (not shown in FIG. 2A).

The arrangement 200 may include an antenna coupler 104-C that may be configured to couple (e.g. capacitively couple) to the antenna 104. The chip 102 may be electrically connected to the antenna coupler 104-C by means of at least one via 202 and at least one electrically conductive track 204. The at least one via 202 may, for example, be formed in the carrier 299 (e.g. PCB), as shown in FIG. 2A. The at least one electrically conductive track 204 may, for example, be formed at a surface (e.g. a top and/or a bottom surface) of the carrier 299 (e.g. PCB). In an example where the carrier 299 may include, or may be, a PCB, the at least one electrically conductive track 204 may be a PCB track.

The arrangement 200 may include at least one test connector 208, which may, for example, provide a test interface to the chip 102, the antenna coupler 104-C, and the antenna 104 (e.g. by means of the capacitive coupling between the antenna coupler 104-C and the antenna 104). The at least one test connector 208 may include, or may be, a coaxial connector. The at least one test connector 208 may be coupled (e.g. electrically coupled) to a switch (e.g. a mechanical switch) that may, for example, be used in conjunction with testing. The at least one test connector 208 may be electrically connected to each of the chip 102 and the antenna coupler 104-C by means of the at least one via 202 and the at least one electrically conductive track 204.

As described above, the antenna 104 may include, or may be, an antenna having a narrowband and/or a high Q factor. However, as the Q factor of the antenna 104 increases, an electrical current flowing in the antenna 104 may increase. Furthermore, an electrical current flowing in components that may be connected to the antenna 104 may increase. For example, an electrical current flowing in the at least one via 202, the at least one electrically conductive track 204, and the antenna coupler 104-C may increase as the Q factor of the antenna 104 increases. Therefore, there may be loss (e.g. resistive loss and/or dielectric loss) that may be incurred in the arrangement 200 shown in FIG. 2A. Accordingly, an efficiency of the antenna 104 may decrease.

Whilst it may be possible to minimize the loss (e.g. resistive loss and/or dielectric loss) in the antenna coupler 104-C by choosing a material with a low loss tangent, the electrical connection between the chip 102 and the antenna coupler 104-C may include the at least one via 202 and the at least one electrically conductive track 204. The at least one via 202 and the at least one electrically conductive track 204 may, for example, include, or may consist of, a low cost material (e.g. solder) that may incur high loss (e.g. resistive loss). Furthermore, since the at least one test connector 208 may provide a test interface by means of, for example, an electrical connection (e.g. a coaxial connection), further loss (e.g. resistive loss) may be incurred by the at least one test connector 208.

As described above, the chip 102 may include a transceiver and an amplifier (e.g. a power amplifier), and possibly a tuner (e.g. an antenna tuner). In other words, a transceiver, an amplifier (and optionally a tuner) may all be included in a single chip. Alternatively, one or more of the aforementioned components may be included in individual chips, as shown in FIG. 2B and FIG. 2C.

FIG. 2B shows an arrangement 201 including a first chip 102-1 including an amplifier (e.g. a power amplifier), and further including a second chip 102-2 including a transceiver.

As shown in FIG. 2B, the first chip (amplifier) 102-1 and the second chip (transceiver) 102-2 may be electrically connected to each other via at least one via 212 and at least one electrically conductive track 214. Accordingly, further loss (e.g. resistive loss) may be incurred by the electrical connection between the first chip (amplifier) 102-1 and the second chip (transceiver) 102-2.

FIG. 2C shows an arrangement 203 including a first chip 102-1 including an amplifier (e.g. a power amplifier), a second chip 102-2 including a transceiver, and a third chip 102-3 including a tuner.

As shown in FIG. 2C, there may be a greater number of electrical connections provided among the first chip (amplifier) 102-1 (e.g. a power amplifier), the second chip (transceiver) 102-2, and the third chip (tuner) 102-3. Accordingly, further loss (e.g. resistive loss) may be incurred by these electrical connections.

In view of the above-mentioned features of the arrangements shown in FIG. 2A to FIG. 2C, the following needs may be identified:

There may be a need to substantially reduce or eliminate resistive and/or dielectric loss in an antenna.

There may be a need to substantially reduce or eliminate resistive and/or dielectric loss in an antenna coupler.

There may be a need to substantially reduce or eliminate resistive and/or dielectric loss in a coupling between an antenna and an antenna coupler.

There may be a need to substantially reduce or eliminate resistive and/or dielectric loss in a coupling between a chip and an antenna coupler.

There may be a need to substantially reduce or eliminate resistive and/or dielectric loss in a coupling between a chip and an antenna.

There may be a need to substantially reduce or eliminate resistive and/or dielectric loss in a test interface.

There may be a need to substantially reduce a cost of testing an antenna coupler and/or a chip.

There may be a need to increase an efficiency of an antenna.

One or more of the aforementioned needs may, for example, be met by the semiconductor device shown in FIG. 3.

Figure 3A:
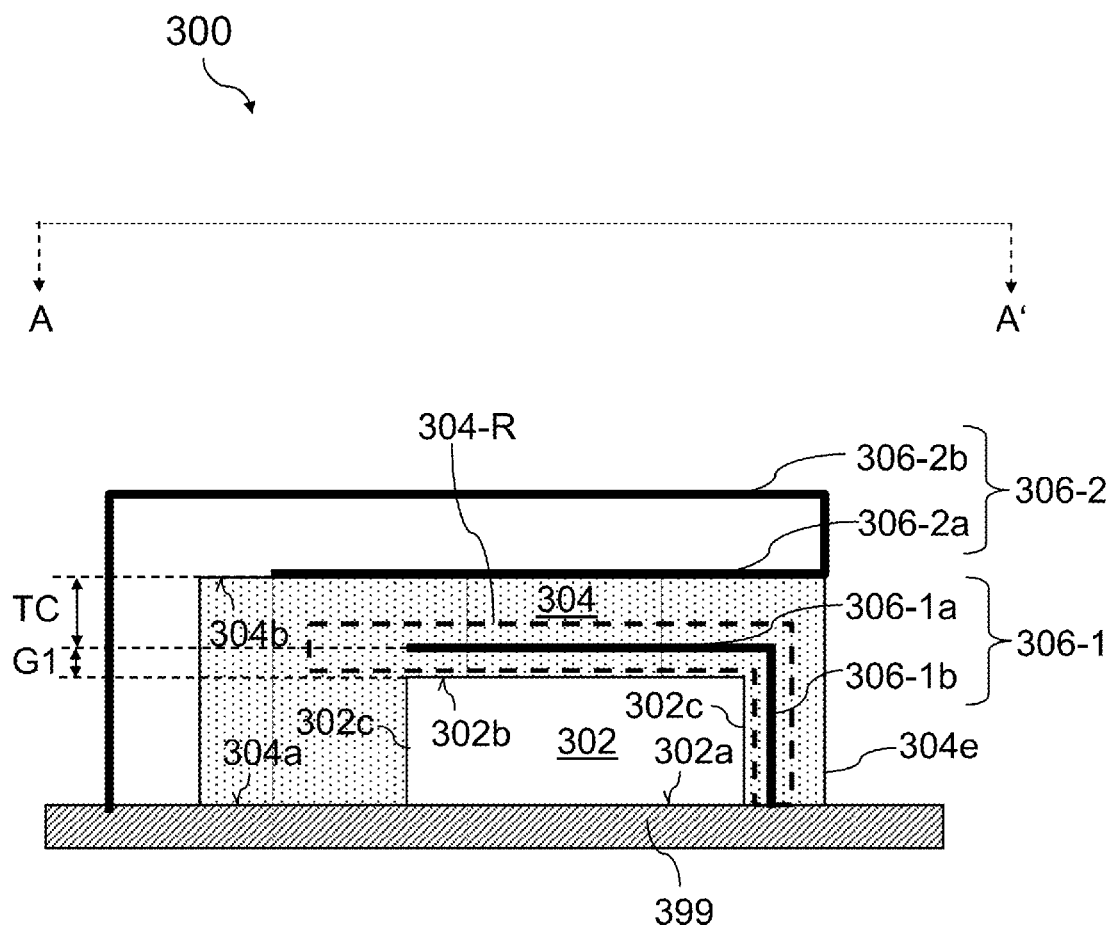
FIG. 3A and FIG. 3B show various cross-sectional views of semiconductor devices.

FIG. 3A shows a cross-sectional view of a semiconductor device 300.

The semiconductor device 300 may include a chip 302, a chip packaging structure 304, a first capacitive coupling structure 306-1, and a second capacitive coupling structure 306-2.

One chip 302 is shown as an example, however the number of chips 302 may be greater than one, and may, for example, be two, three, four, five, etc. For example, the semiconductor device 300 may include a plurality of chips 302, which may, for example, be arranged laterally adjacent to each other and/or arranged in a stack in which a chip of the plurality of chips 302 may be stacked on another chip of the plurality of chips 302.

The chip 302 shown in FIG. 3 may, for example, be identified with the chip 102 shown in FIG. 1 or with one of the chips 102-1, 102-2, 102-3 shown in FIG. 2A to FIG. 2C.

The chip 302 (or die) may include, or may be, a chip (or die) for use in communications applications. For example, the chip 302 may be a chip (or die) for use in a communications system, for example a radio communications network.

The chip 302 may include, or may be, at least one of a transceiver, an amplifier (e.g. a power amplifier), and a tuner (e.g. an antenna tuner). The transceiver, which may be included in the chip 302, may be configured to control a transmission and/or reception of a signal in a communications system, for example a radio communications network. The amplifier, which may be included in the chip 302, may be configured to amplify a signal (e.g. an amplitude and/or power of a signal) that may, for example, be transmitted and/or received in a communications system, for example a radio communications network. The tuner, which may be included in the chip 302, may be configured to select (e.g. tune to) a frequency and/or frequency band which may, for example, be used to transmit and/or receive a signal in a communications system, for example a radio communications network. The chip 302 may include a passive component (e.g. a resistor and/or capacitor and/or inductor).

The chip 302 may include a semiconductor substrate, which may include, or may consist of, a semiconductor material. The semiconductor material may include, or may be, at least one material selected from a group of materials, the group consisting of: silicon, germanium, gallium nitride, gallium arsenide, and silicon carbide, although other materials may be possible as well.

The chip 302 may have a first side 302a and a second side 302b opposite the first side 302a. The chip 302 may further include at least one sidewall 302c. The first side 302a and the second side 302b of the chip 302 may include, or may be, a frontside and a backside of the chip 302, respectively. By way of another example, the first side 302a of the chip 302 may include, or may be, an active side of the chip 302. By way of yet another example, the first side 302a and the second side 302b of the chip 302 may include, or may be, a bottom surface and a top surface of the chip 302, respectively.

The chip 302 may be disposed over (e.g. disposed on) a carrier 399. For example, in the semiconductor device 300 shown in FIG. 3A, the first side 302a (e.g. frontside) of the chip 302 may face the carrier 399. The carrier 399 may, for example, be identified with the carrier 299 shown in FIG. 2A to FIG. 2C. The carrier 399 may, for example, include, or may be, a printed circuit board (PCB).

The semiconductor device 300 may include the chip packaging structure 304.

The chip packaging structure 304 may have a first side 304a and a second side 304b opposite the first side 304a. The first side 304a and the second side 304b of the chip packaging structure 304 may, for example, be outer sides of the chip packaging structure 300, as shown in FIG. 3A. The first side 304a of the chip packaging structure 304 may, for example, be a frontside of the chip packaging structure 304. The second side 304b of the chip packaging structure 304 may, for example, be a backside of the chip packaging structure 304.

The second side 304b of the chip packaging structure 304 may face away from the chip 302, as shown in FIG. 3A. For example, the second side 304b of the chip packaging structure 304 may face in a same direction as the second side 302b (e.g. backside) of the chip 302. For example, as shown in FIG. 3A, the second side 304b of the chip packaging structure 304 and the second side 302b (e.g. backside) of the chip 302 may face away from the first side 302a of the chip 302. The first side 304a of the chip packaging structure 304 may be at least substantially flush with the first side 302a (e.g. frontside) of the chip 302. In other words, the first side 304a of the chip packaging structure 304 and the first side 302a of the chip 302 may form an at least substantially flat surface of the semiconductor device 300, as shown in FIG. 3A. Alternatively, the chip packaging structure 304 may cover the first side 302a (e.g. frontside) of the chip 302 at least partially.

The chip packaging structure 304 may at least partially encapsulate the chip 302. In other words, the chip packaging structure 304 may at least partially surround the chip 302. For example, in the semiconductor device 300 shown in FIG. 3A, the chip packaging structure 304 may enclose the chip 302 from at least one sidewall 302c (e.g. from all sidewalls 302c) and the second side 302b. In another example (e.g. in which the chip packaging structure 304 may cover the first side 302a (e.g. frontside) of the chip 302), the chip packaging structure 304 may enclose the chip 302 from at least one sidewall 302c (e.g. from all sidewalls 302c), the first side 302a, and the second side 302b. In such an example, the chip packaging structure 304 may enclose (e.g. fully enclose) the chip 302 from all sides.

The chip packaging structure 304 may include, or may consist of, a material that may be different from the chip 302. The chip packaging structure 304 may include, or may consist of, an insulating material. The chip packaging structure 304 may include, or may consist of, a molding material (namely, a material that may be molded, e.g. by means of a molding process). For example, the chip packaging structure 304 may include, or may consist of, a mold compound. By way of another example, the chip packaging structure 304 may include, or may consist of, a chip packaging material (namely, a material that may be suitable for packaging and/or encapsulating a chip).

The chip packaging structure 304 may include, or may consist of, at least one material selected from a group of materials, the group consisting of: a plastic material, a ceramic material, and glass, although other materials may be possible as well. By way of an example, the chip packaging structure 304 may include, or may consist of, a plastic material (e.g. an epoxy resin or blend, e.g. a thermosetting molding compound, e.g. a thermoplastic, e.g. a high purity fluoropolymer) possibly including filler particles made of silica, rubber, glass, ceramic or other materials that may be suitable for filler particles.

The semiconductor device 300 may include the first capacitive coupling structure 306-1.

The chip packaging structure 304 may include a receiving region 304-R, which may be configured to receive the first capacitive coupling structure 306-1. As shown in FIG. 3A, the receiving region 304-R may include at least a part of the chip packaging structure 304 that may, for example, be disposed at (e.g. disposed on or over) the chip 302 (e.g. the second side 302b of the chip 302). For example, the receiving region 304-R may include the part of the chip packaging structure 304 disposed between the second side 302b (e.g. backside) of the chip 302 and the second side 304b (e.g. backside) of the chip packaging structure 304.

The first capacitive coupling structure 306-1 may be disposed in the receiving region 304-R of the chip packaging structure 304. As described above, the receiving region 304-R may include at least a part of the chip packaging structure 304 that may, for example, be disposed at (e.g. disposed on or over) the chip 302 (e.g. the second side 302b of the chip 302). Accordingly, the first capacitive coupling structure 306-1 may be disposed at or over the second side 302b (e.g. backside) of the chip 302.

For example, in the semiconductor device 300 shown in FIG. 3A, the first capacitive coupling structure 306-1 may include a part 306-1a, which may, for example, be disposed in the part of the chip packaging structure 304 disposed between the second side 302b (e.g. backside) of the chip 302 and the second side 304b of the chip packaging structure 304. As shown in FIG. 3A, the first capacitive coupling structure 306-1 may include a part 306-1b that may, for example, be disposed next to the chip 302, e.g. between a sidewall 302c of the chip 302 and a sidewall 304e of the chip packaging structure 304, as shown.

The first capacitive coupling structure 306-1 may be at least partially embedded in the chip packaging structure 304 (e.g. in the receiving region 304-R of the chip packaging structure 304). For example, in the semiconductor device 300 shown in FIG. 3A, the part 306-1a of the first capacitive coupling structure 306-1 disposed in the part of the chip packaging structure 304 disposed between the second side 302b (e.g. backside) of the chip 302 and the second side 304b of the chip packaging structure 304, and the part 306-1b disposed next to the chip, e.g. between the sidewall 302c of the chip 302 and the sidewall 304e of the chip packaging structure 304, may be fully embedded in the chip packaging structure 304. In another example, the part 306-1a of the first capacitive coupling structure 306-1 may be disposed at (e.g. on or over) the second surface 304b of the chip packaging structure 304 and the part 306-1b disposed next to the chip 302 may be fully embedded in the chip packaging structure 304. In such an example, the first capacitive coupling structure 306-1 may be partially embedded in the chip packaging structure 304 (see description below, e.g. in respect of FIG. 10 to FIG. 15).

The first capacitive coupling structure 306-1 may, for example, be coupled (e.g. electrically coupled) to the chip 302. For example, the part 306-1b of the first capacitive coupling structure 306-1 may be coupled (e.g. electrically coupled) to the chip 302.

As described above, the chip 302 may, for example, be configured for use in a communications system, for example a radio communications network. In such an example, the chip 302 may include a contact (e.g. an output contact, for example, a radio-frequency (RF) output contact) that may, for example, be coupled (e.g. electrically coupled) to the part 306-1b of the first capacitive coupling structure 306-1, thus coupling (e.g. electrically coupling) the first capacitive coupling structure 306-1 and the chip 302 to each other.

The first capacitive coupling structure 306-1 may, for example, be at least partially embedded in the chip packaging structure 304 such that there may be a portion of the chip packaging structure 304 disposed between the first capacitive coupling structure 306-1 and the chip 302. For example, in the semiconductor device 300 shown in FIG. 3A, there may be a portion of the chip packaging structure 304 disposed between the part 306-1a of the first capacitive coupling structure 306-1 and the second side 302b (e.g. backside) of the chip 302. In other words, the chip 302 (e.g. the second side 302b, for example backside, of the chip 302) and the first capacitive coupling structure 306-1 (e.g. the part 306-1a of the first capacitive coupling structure 306-1) disposed in the receiving region 304-R of the chip packaging structure 304 may be spaced apart from each other by some distance G1, which may correspond to a thickness of the portion of the chip packaging structure 304 disposed in-between. The distance G1 may, for example, be in the range from about 0.1 mm to about 3 mm, for example in the range from about 0.5 mm to about 2 mm, for example about 1 mm, although other distances may be possible as well.

The first capacitive coupling structure 306-1 may include, or may consist of, at least one electrically conductive material selected from a group of electrically conductive materials. For example, the first capacitive coupling structure 306-1 may include, or may consist of, a metal or metal alloy. For example, the first capacitive coupling structure 306-1 may include, or may consist of, copper or a copper alloy. By way of another example, the first capacitive coupling structure 306-1 may include, or may consist of, aluminum or an aluminum alloy.

The first capacitive coupling structure 306-1 may include, or may be, an antenna coupling element (which may also be referred to as an "antenna coupler"). In other words, the first capacitive coupling structure 306-1 may include, or may be, an element for coupling to an antenna (e.g. by means of capacitive coupling). For example, the first capacitive coupling structure 306-1 may be identified with the antenna coupler 104-C shown in FIG. 2A to FIG. 2C.

The first capacitive coupling structure 306-1 may include, or may be, a coupling plate. For example, in the semiconductor device 300 shown in FIG. 3A, the part 306-1a of the first capacitive coupling structure 306-1 may include, or may be, a coupling plate. The coupling plate (e.g. the part 306-1a of the first capacitive coupling structure 306-1) may include, or may be, a metal plate (e.g. a copper and/or aluminum plate) or a metal alloy plate (e.g. a copper alloy and/or an aluminum alloy plate).

The coupling plate (e.g. the part 306-1a of the first capacitive coupling structure 306-1) may, for example, have a size (e.g. a dimension, e.g. a length and/or a width and/or a thickness) that may, for example, fall within a certain range of values.

Figure 4A:
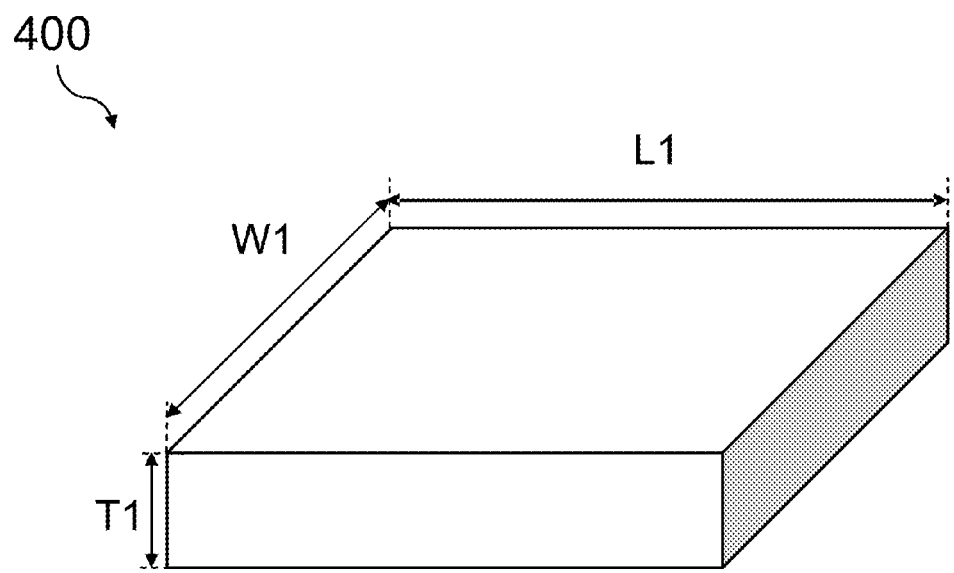
FIG. 4A and FIG. 4B show various views of coupling plates.

FIG. 4A shows a view of a coupling plate 400, which may, for example, be identified with the part 306-1a of the first capacitive coupling structure 306-1.

As shown in FIG. 4A, the coupling plate 400 may have a length L1 that may be measured in a direction parallel to the second side 302b of the chip 302. The length L1 of the coupling plate 400 may, for example, be in the range from about 0.5 mm to about 5 mm, for example in the range from about 1 mm to about 3 mm, for example about 2 mm, although other lengths may be possible as well.

As shown in FIG. 4A, the coupling plate 400 may have a width W1 that may be measured in a direction parallel to the second side 302b of the chip 302 and perpendicular to the length L1. The width W1 of the coupling plate 400 may, for example, be in the range from about 0.5 mm to about 5 mm, for example in the range from about 1 mm to about 3 mm, for example about 2 mm, although other widths may be possible as well.

As shown in FIG. 4A, the coupling plate 400 may have a thickness T1 that may be measured in a direction perpendicular to the length L1 and the width W1. The thickness T1 of the coupling plate 400 may, for example, be in the range from about 0.1 mm to about 3 mm, for example in the range from about 0.5 mm to about 2 mm, for example about 1 mm, although other thicknesses may be possible as well.

The semiconductor device 300 shown in FIG. 3A may include the second capacitive coupling structure 306-2.

The second capacitive coupling structure 306-2 may be disposed over the first capacitive coupling structure 306-1. For example, in the semiconductor device 300 shown in FIG. 3A, the second capacitive coupling structure 306-2 may include a part 306-2a that may, for example, be disposed over the part 306-1a of the first capacitive coupling structure 306-1.

There may be a capacitive coupling between the second capacitive coupling structure 306-2 and the first capacitive coupling structure 306-1. In other words, the second capacitive coupling structure 306-2 may be capacitively coupled to the first capacitive coupling structure 306-1. For example, as shown in FIG. 3A, the part 306-2a of the second capacitive coupling structure 306-2 and the part 306-1a of the first capacitive coupling structure 306-1 may for example, be identified with plates of a capacitor. Accordingly, the part 306-2a of the second capacitive coupling structure 306-2 and the part 306-1a of the first capacitive coupling structure 306-1 may be capacitively coupled to each other.

The second capacitive coupling structure 306-2 may, for example, be disposed at (e.g. disposed on or over) the second side 304b of the chip packaging structure 304, as shown in FIG. 3A.

The second capacitive coupling structure 306-2 may be attached to the second side 304b of the chip packaging structure 304. The second capacitive coupling structure 306-2 may be attached to the second side 304b of the chip packaging structure 304, for example, by means of gluing. In other words, the second capacitive coupling structure 306-2 may be glued to the second side 304b of the chip packaging structure 304. For example, in the semiconductor device 300 shown in FIG. 3A the part 306-2a of the second capacitive coupling structure 306-2 may be glued to the second side 304b of the chip packaging structure 304. Alternatively, or in addition, the second capacitive coupling structure 306-2 may be attached to the second side 304b of the chip packaging structure 304, for example, by means of welding.

The second capacitive coupling structure 306-2 may be attached to the second side 304b of the chip packaging structure 304, for example, by means of a resilient structure 308 (e.g. at least one spring force element) that may, for example, be disposed at (e.g. disposed on or over) the second side 304b of the chip packaging structure 304.

Figure 3B:
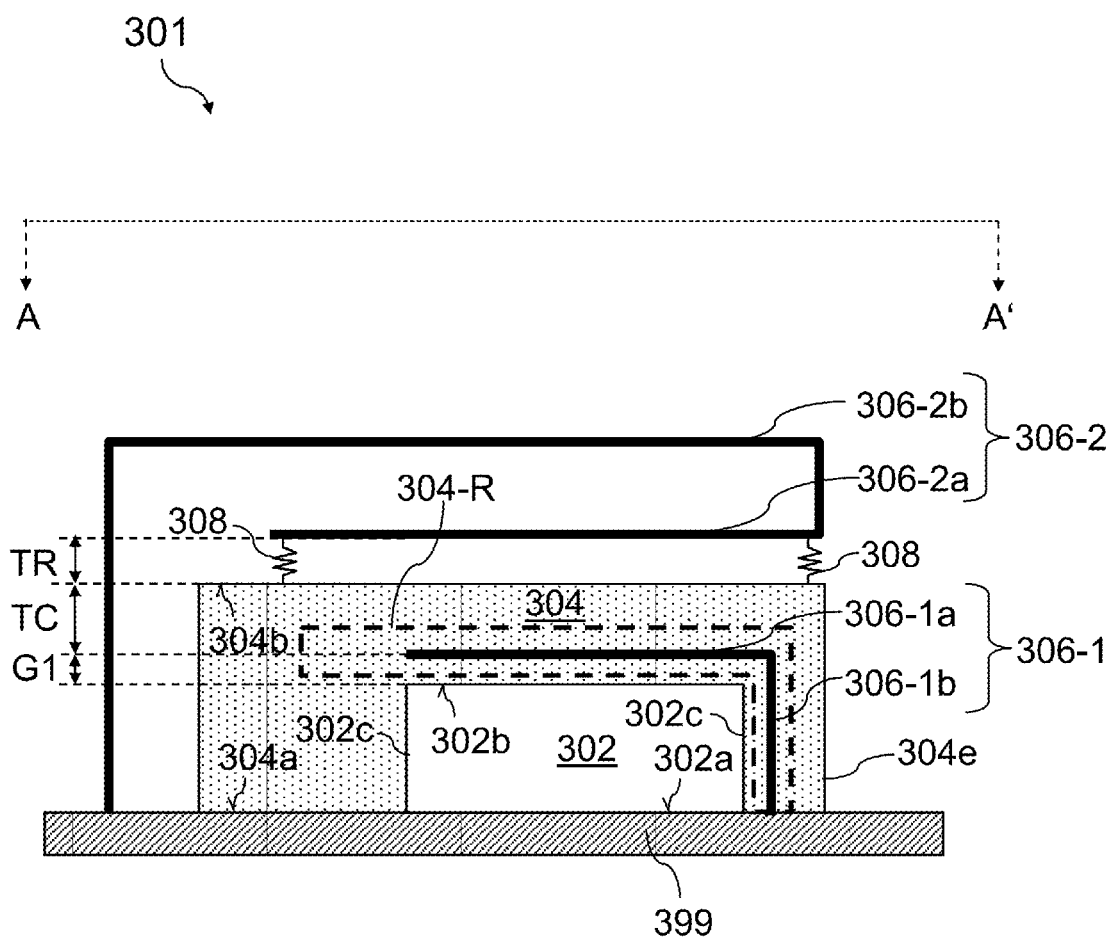

FIG. 3B shows a cross-sectional view of a semiconductor device 301 including the resilient structure 308.

Reference signs in FIG. 3B that are the same as in FIG. 3A denote the same or similar elements as in FIG. 3A. Thus, those elements will not be described in detail again here; reference is made to the description above.

As shown in FIG. 3B, the resilient structure 308 (e.g. at least one spring force element) may be attached to the second side 304b of the chip packaging structure 304. The resilient structure 308 (e.g. at least one spring force element) may, for example, be further attached to the second capacitive coupling structure 306-2. For example, in the semiconductor device 301 shown in FIG. 3B, the resilient structure 308 (e.g. at least one spring force element) may be attached to the part 306-2a of the second capacitive coupling structure 306-2. Accordingly, the second capacitive coupling structure 306-2 (e.g. the part 306-2a of the second capacitive coupling structure 306-2) may be attached to the second side 304b of the chip packaging structure 304, e.g. by means of the resilient structure 308 (e.g. at least one spring force element).

In the semiconductor device shown in FIG. 3B, the resilient structure 308 (e.g. at least one spring force element) may be attached to the second side 304b of the chip packaging structure 304 and may be laterally outside the receiving region 304-R. However, in another example, the resilient structure 308 (e.g. spring force element) may be attached to the second side 304b of the chip packaging structure 304 and may be laterally within the receiving region 304-R.

As shown in FIG. 3A and FIG. 3B, the chip packaging structure 304, the first capacitive coupling structure 306-1 and the second capacitive coupling structure 306-2 may be arranged such that there may be a portion of the chip packaging structure 304 disposed between the first capacitive coupling structure 306-1 and the second capacitive coupling structure 306-2. For example, in the semiconductor devices 300 and 301 shown in FIG. 3A and FIG. 3B, respectively, a portion of the chip packaging structure 304 may be disposed between the part 306-1a of the first capacitive coupling structure 306-1 and the part 306-2a of the second capacitive coupling structure 306-2.

The portion of the chip packaging structure 304 that may be disposed between the first capacitive coupling structure 306-1 and the second capacitive coupling structure 306-2 may have a thickness TC. For example, in the semiconductor device 300 shown in FIG. 3A, the part 306-1a of the first capacitive coupling structure 306-1 and the part 306-2a of the second capacitive coupling structure 306-2 may be separated by a distance that may be at least substantially equal to the thickness TC of the portion of the chip packaging structure 304 disposed between the first capacitive coupling structure 306-1 and the second capacitive coupling structure 306-2. However, in the semiconductor device 301 shown in FIG. 3B, the part 306-1a of the first capacitive coupling structure 306-1 and the part 306-2a of the second capacitive coupling structure 306-2 may be separated by a distance that may be at least substantially equal to a sum of the thickness TC and a length TR of the resilient structure 308 (e.g. spring force element) disposed between the second capacitive coupling structure 306-2 and the second side 304b of the chip packaging structure 304.

The thickness TC of the portion of the chip packaging structure 304 disposed between the first capacitive coupling structure 306-1 and the second capacitive coupling structure 306-2 may be in the range from about 0.1 mm to about 3 mm, for example in the range from about 0.5 mm to about 2 mm, for example about 1 mm, although other thicknesses may be possible as well. In other words, in the semiconductor device 300 shown in FIG. 3A, the part 306-1a of the first capacitive coupling structure 306-1 and the part 306-2a of the second capacitive coupling structure 306-2 may be separated by a distance that may be in the range from about 0.1 mm to about 3 mm, for example in the range from about 0.5 mm to about 2 mm, for example about 1 mm, although other separation distances may be possible as well.

As described above in relation to the semiconductor device 301 shown in FIG. 3B, the resilient structure 308 (e.g. a spring force element) may, for example, attach the second capacitive coupling structure 306-2 (e.g. the part 306-2b of the second capacitive coupling structure 306-2) to the chip packaging structure 304 (e.g. the second side 304b of the chip packaging structure 304). The length TR of the resilient structure 308 (e.g. a spring force element) may, for example, be calibrated in order to separate the first capacitive coupling structure 306-1 (e.g. the part 306-1a of the first capacitive coupling structure 306-1) and the second capacitive coupling structure 306-2 (e.g. the part 306-2a of the second capacitive coupling structure 306-2) by a desired distance that may, for example, fall in the above-identified range of distances.

The distances TC and/or TR may, for example, be determined or selected in accordance with desired coupling characteristics between the first and second capacitive coupling structures 306-1, 306-2.

The second capacitive coupling structure 306-2 may include, or may consist of, at least one electrically conductive material selected from a group of electrically conductive materials. For example, the second capacitive coupling structure 306-2 may include, or may consist of, a metal or metal alloy. For example, the second capacitive coupling structure 306-2 may include, or may consist of, copper or a copper alloy. By way of another example, the second capacitive coupling structure 306-2 may include, or may consist of, aluminum or an aluminum alloy.

The second capacitive coupling structure 306-2 may include, or may be, an antenna. For example, the second capacitive coupling structure 306-2 may be configured to transmit and/or receive a signal. For example, the second capacitive coupling structure 306-2 may be configured to radiate a signal (e.g. a communications signal).

The second capacitive coupling structure 306-2 may include, or may be, a coupling plate. For example, in the semiconductor device 300 shown in FIG. 3A and FIG. 3B, the part 306-2a of the second capacitive coupling structure 306-2 may include, or may be, a coupling plate. The coupling plate (e.g. the part 306-2a of the second capacitive coupling structure 306-2) may include, or may be, a metal plate (e.g. a copper and/or aluminum plate) or a metal alloy plate (e.g. a copper alloy and/or an aluminum alloy plate).

The coupling plate (e.g. the part 306-2a of the second capacitive coupling structure 306-2) may, for example, have a size (e.g. a dimension, e.g. a length and/or a width and/or a thickness) that may, for example, fall within a certain range of values.

Figure 4B:
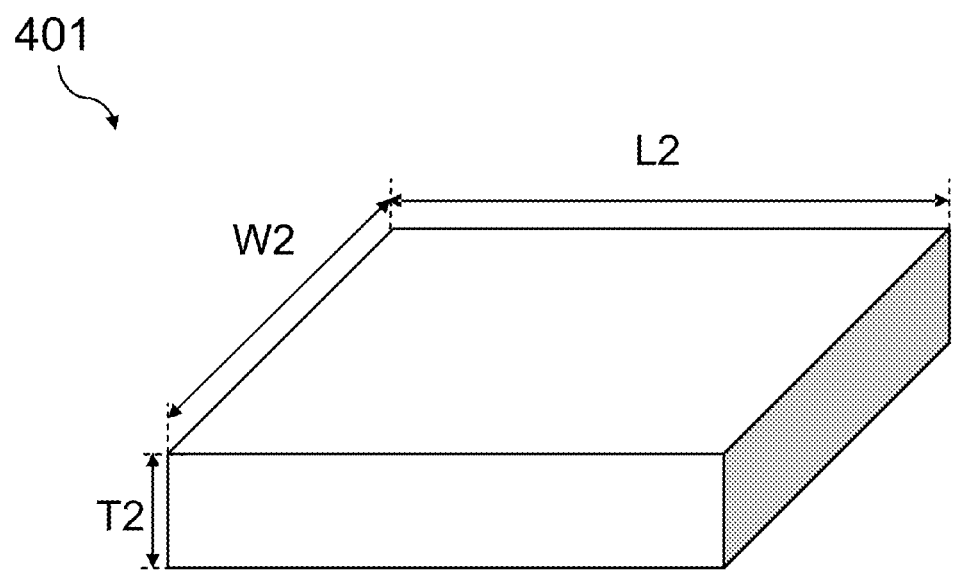

FIG. 4B shows a view of a coupling plate 401, which may, for example, be identified with the part 306-2a of the second capacitive coupling structure 306-2.

As shown in FIG. 4B, the coupling plate 401 may have a length L2 that may be measured in a direction parallel to the second side 302b of the chip 302. The length L2 of the coupling plate 401 may, for example, be in the range from about 0.5 mm to about 5 mm, for example in the range from about 1 mm to about 3 mm, for example about 2 mm, although other lengths may be possible as well.

As shown in FIG. 4B, the coupling plate 401 may have a width W2 that may be measured in a direction parallel to the second side 302b of the chip 302 and perpendicular to the length L2. The width W2 of the coupling plate 401 may, for example, be in the range from about 0.5 mm to about 5 mm, for example in the range from about 1 mm to about 3 mm, for example about 2 mm, although other widths may be possible as well.

As shown in FIG. 4B, the coupling plate 401 may have a thickness T2 that may be measured in a direction perpendicular to the length L2 and the width W2. The thickness T2 of the coupling plate 400 may, for example, be in the range from about 0.1 mm to about 3 mm, for example in the range from about 0.5 mm to about 2 mm, for example about 1 mm, although other thicknesses may be possible as well.

The coupling plate 401 of the second capacitive coupling structure 306-2 may be disposed substantially parallel to the coupling plate 400 of the first capacitive coupling structure 306-1.

Figure 5A:
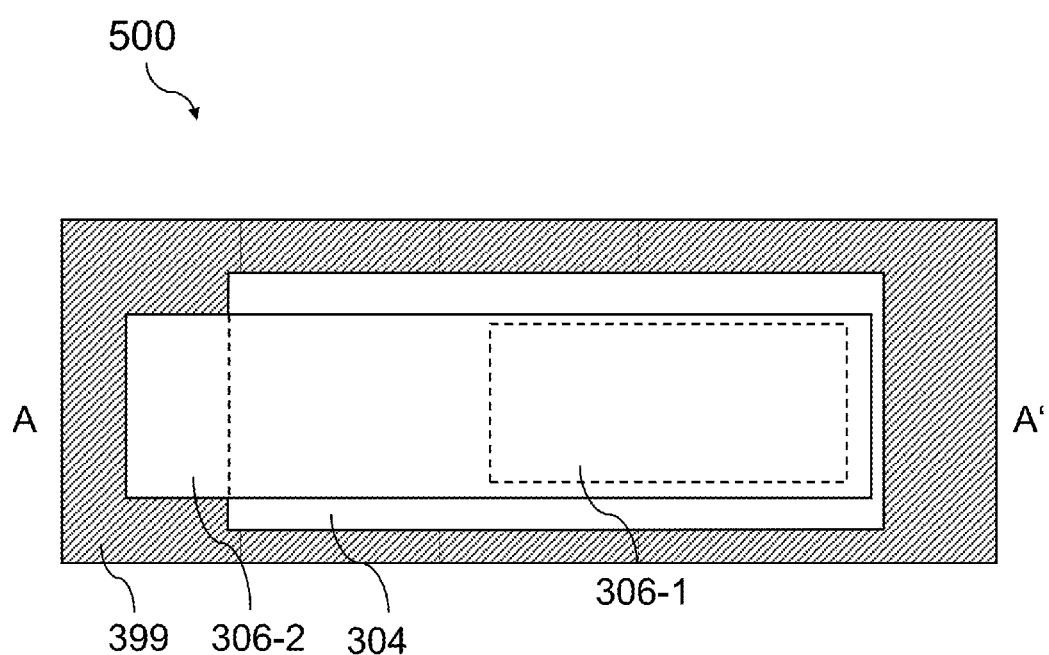
FIG. 5A and FIG. 5B show various plan views of semiconductor devices.

FIG. 5A shows a plan view 500 of the semiconductor device 300 shown in FIG. 3A and/or the semiconductor device 301 shown in FIG. 3B along the line A-A'.

As shown in the view 500, the second capacitive coupling structure 306-2 (e.g. antenna) may be disposed over the first capacitive coupling structure 306-1 (e.g. antenna coupling element) that may, for example, be at least partially embedded (e.g. fully embedded) in the chip packaging structure 304 that may, for example, be disposed over the carrier 399 (e.g. PCB).

As described above, the first capacitive coupling structure 306-1 (e.g. antenna coupling element) and the second capacitive coupling structure 306-2 (e.g. antenna) may be capacitively coupled, e.g. via the parts 306-1a and 306-2a (e.g. coupling plates, e.g. metal plates), which may behave as a capacitor.

The semiconductor device 300 shown in FIG. 3A and the semiconductor device 301 shown in FIG. 3B show one first capacitive coupling structure 306-1 and one second capacitive coupling structure 306-2. However, the number of first capacitive coupling structures 306-1 (e.g. antenna coupling elements) may be greater than one, and may, for example, be two, three, four, five, etc. In like manner, the number of second capacitive coupling structures 306-2 (e.g. antennas) may be greater than one, and may, for example, be two, three, four, five, etc.

Figure 5B:
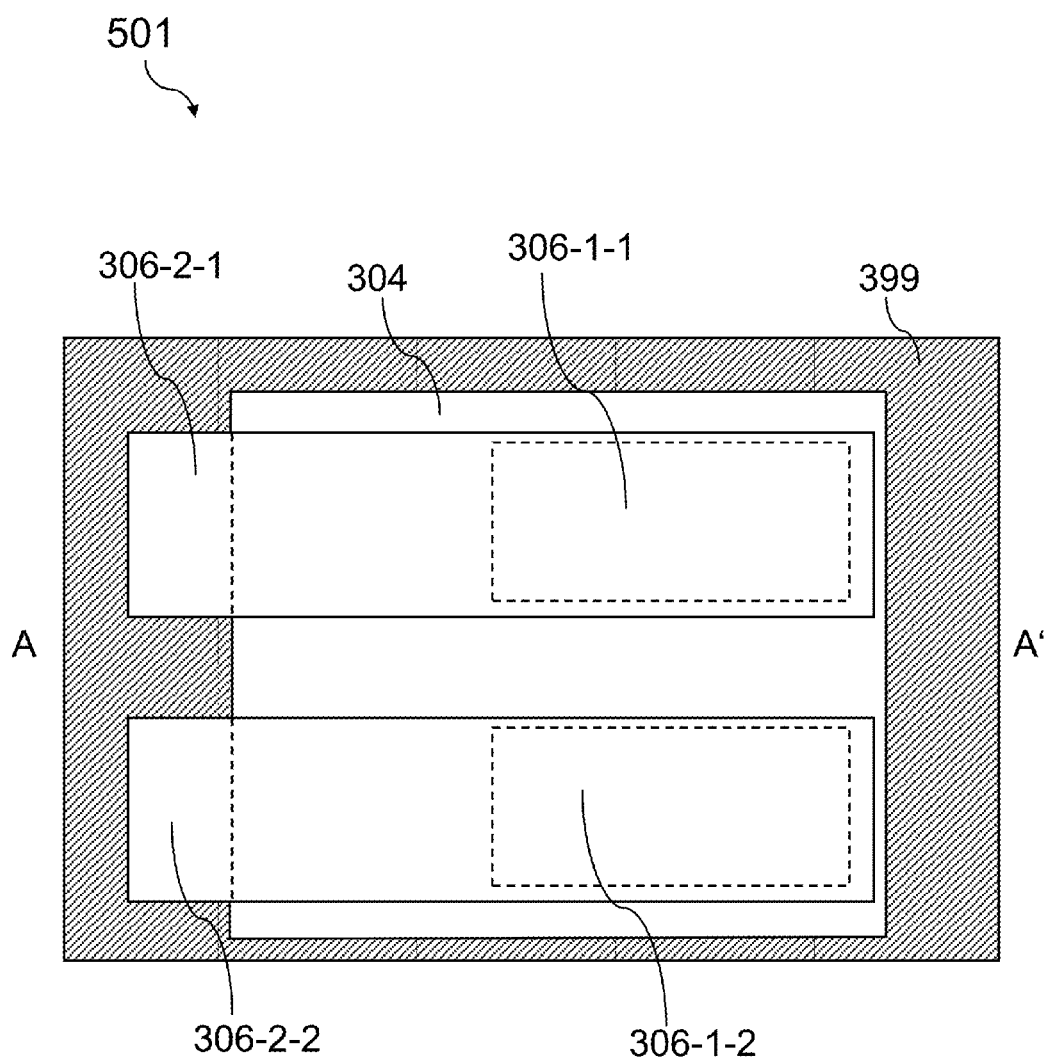

FIG. 5B shows a plan view 501 of a semiconductor device including a plurality of first capacitive coupling structures 306-1 and a plurality of second capacitive coupling structures 306-2.

As shown in the view 501, chip packaging structure 304 may have a plurality of first capacitive coupling structures 306-1-1, 306-1-2 (e.g. antenna coupling elements) at least partially embedded (e.g. fully embedded) in it. As shown in the view 501, the plurality of first capacitive coupling structures 306-1-1, 306-1-2 (e.g. antenna coupling elements) may be at least partially embedded (e.g. at least partially enclosed and/or encapsulated) in one package that may, for example, be provided by the chip packaging structure 304.

The semiconductor device shown in FIG. 5B may include a plurality of second capacitive coupling structures 306-2-1, 306-2-2 (e.g. antennas) that may be disposed over the plurality of first capacitive coupling structures 306-1-1, 306-1-2 (e.g. antenna coupling elements). For example, in the view 501 shown in FIG. 5B, a respective second capacitive coupling structure (e.g. antenna) may be disposed over a respective first capacitive coupling structure (e.g. antenna coupling element). For example, the second capacitive coupling structure 306-2-1 may be disposed over the first capacitive coupling structure 306-1-1. In like manner, the second capacitive coupling structure 306-2-2 may be disposed over the first capacitive coupling structure 306-1-2. The respective first capacitive coupling structure 306-1 (e.g. antenna coupling element) and the respective second capacitive coupling structure 306-2 (e.g. antenna) may be capacitively coupled to each other. The respective first capacitive coupling structure 306-1 (e.g. antenna coupling element) and the respective second capacitive coupling structure 306-2 (e.g. antenna) may be separated by a distance from each other, e.g. distance TC as shown in FIG. 3A or distance TC+TR as shown in FIG. 3B, or distance TR (not shown).

The plurality of first capacitive coupling structures 306-1-1, 306-1-2 (e.g. antenna coupling elements) may, for example, be configured to tune in to a plurality of frequencies or frequency bands. For example, the first capacitive coupling structure 306-1-1 may be configured to tune in to a first frequency or frequency band, and the second capacitive coupling structure 306-1-2 may be configured to tune in to a second frequency or frequency band that may be different from the first frequency or frequency band. Accordingly, the plurality of first capacitive coupling structures 306-1-1, 306-1-2 (e.g. antenna coupling elements) may, for example, be configured to support multi-frequency reception and/or transmission of a signal.

In another example, the first capacitive coupling structure 306-1-1 may be configured to tune in to a first frequency or frequency band, and the second capacitive coupling structure 306-1-2 may be configured to tune in to a second frequency or frequency band that may be identical to the first frequency or frequency band. In such an example, the plurality of first capacitive coupling structures 306-1-1, 306-1-2 (e.g. antenna coupling elements) may provide transmission and/or reception diversity to a device that may include the semiconductor device shown in FIG. 5B. For example, a device that may include the semiconductor device shown in FIG. 5B may be configured for use in a multiple-input multiple-output (MIMO) communications system.

As described above, the chip 302 may, for example, be configured for use in a communications system, for example a radio communications network. In such an example, the chip 302 may include a contact (e.g. an output contact, for example, a radio-frequency (RF) output contact) that may, for example, be coupled (e.g. electrically coupled) to the first capacitive coupling structure 306-1 (e.g. the part 306-1b). As described above, the second capacitive coupling structure 306-2 (e.g. an antenna, e.g. a radiating and/or receiving antenna) may be capacitively coupled to the first capacitive coupling structure 306-1 (e.g. the part 306-1b).

In order to avoid interference (e.g. radio-frequency interference) between the chip 302 and the second capacitive coupling structure 306-2 (e.g. antenna, e.g. radiating and/or receiving antenna) and/or the first capacitive coupling structure 306-1 (e.g. antenna coupling element), the chip 302 may be a shielded chip 302 (e.g. a radio-frequency shielded chip). In other words, the chip 302 may be shielded against, for example, radio-frequency interference that may be caused by, for example, the capacitive coupling between the second capacitive coupling structure 306-2 (e.g. antenna) and the first capacitive coupling structure 306-1 (e.g. antenna coupling element). In this regard, the semiconductor device 300 and/or the semiconductor device 301 may include a shielding structure, which may, for example, be disposed between the chip 302 and the first capacitive coupling structure 306-1 (see description below e.g. in respect of FIG. 10).

As shown in FIG. 3A and FIG. 3B, an interconnection length between the chip 302 and the second capacitive coupling structure 306-2 (e.g. antenna) may be minimized or at least substantially reduced.

As shown in FIG. 3A and FIG. 3B, the number of electrical connections (e.g. vias and/or tracks) provided to the second capacitive coupling structure 306-2 (e.g. antenna) may be minimized or at least substantially reduced. Accordingly, an effect provided by the semiconductor device 300 and/or the semiconductor device 301 may be substantial reduction or elimination of resistive and/or dielectric loss in the second capacitive coupling structure 306-2 (e.g. antenna).

As shown in FIG. 3A and FIG. 3B, the number of electrical connections (e.g. vias and/or tracks) provided to the first capacitive coupling structure 306-1 (e.g. antenna coupling element) may be minimized or at least substantially reduced. Accordingly, an effect provided by the semiconductor device 300 and/or the semiconductor device 301 may be substantial reduction or elimination of resistive and/or dielectric loss in the first capacitive coupling structure 306-1 (e.g. antenna coupling element).

As shown in FIG. 3A and FIG. 3B, the first capacitive coupling structure 306-1 (e.g. antenna coupling element) may be at least partially embedded in the chip packaging structure 304. Accordingly, an effect provided by the semiconductor device 300 and/or the semiconductor device 301 may be substantial reduction or elimination of resistive and/or dielectric loss in a coupling between the first capacitive coupling structure 306-1 (e.g. antenna coupling element) and the second capacitive coupling structure 306-2 (e.g. antenna).

As shown in FIG. 3A and FIG. 3B, an interconnection length between the chip 302 and the first capacitive coupling structure 306-1 (e.g. antenna coupling element) may be minimized or at least substantially reduced. Accordingly, an effect provided by the semiconductor device 300 and/or the semiconductor device 301 may be substantial reduction or elimination of resistive and/or dielectric loss in a coupling between the chip 302 and the first capacitive coupling structure 306-1 (e.g. antenna coupling element).

As shown in FIG. 3A and FIG. 3B, an interconnection length between the chip 302 and the second capacitive coupling structure 306-2 (e.g. antenna coupling element) may be minimized or at least substantially reduced. Accordingly, an effect provided by the semiconductor device 300 and/or the semiconductor device 301 may be substantial reduction or elimination of resistive and/or dielectric loss in a coupling between the chip 302 and the second capacitive coupling structure 306-2 (e.g. antenna).

Consequently, an effect provided by the semiconductor device 300 and/or the semiconductor device 301 may be an increase in an efficiency of the second capacitive coupling structure 306-2 (e.g. antenna).

Figure 6:
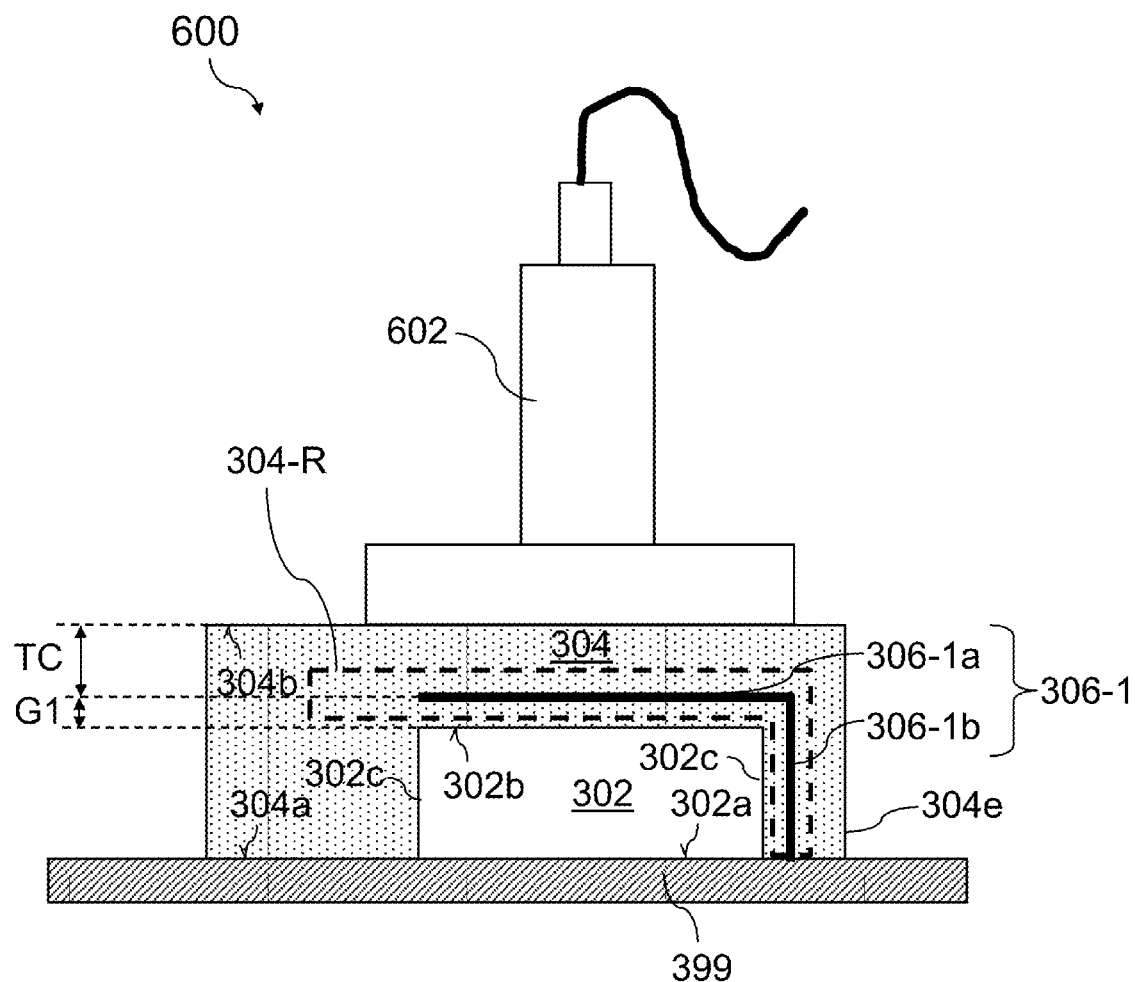
FIG. 6 shows a cross-sectional view of a semiconductor device including a test probe.

FIG. 6 shows a cross-sectional view of a semiconductor device 600 including a test probe 602.

Reference signs in FIG. 6 that are the same as in FIG. 3A and/or FIG. 3B denote the same or similar elements as in FIG. 3A and/or FIG. 3B. Thus, those elements will not be described in detail again here; reference is made to the description above. The various effects described above in relation to the semiconductor devices shown in FIG. 3A and/or FIG. 3B may be analogously valid for the semiconductor device 600 shown in FIG. 6. Differences between FIG. 6 and FIG. 3A and/or FIG. 3B are described below.

As described above in relation to FIG. 2A to FIG. 2C, a test interface may, for example, be provided by the test connector 208 (e.g. coaxial connector), which may be coupled (e.g. electrically coupled) to a switch (e.g. a mechanical switch).

In the semiconductor device 600, the test interface to the first capacitive coupling structure 306-1 (e.g. antenna coupling element) may, for example, be provided by a capacitive coupling between the first capacitive coupling structure 306-1 (e.g. antenna coupling element) and the test probe 602. In other words, the second capacitive coupling structure, which may be coupled capacitively to the first capacitive coupling structure 306-1 (e.g. antenna coupling element), may include, or may be, the test probe 602.

An effect (e.g. an additional effect) provided by the semiconductor device 600 shown in FIG. 6 may be avoidance of a use of a test connector (e.g. a coaxial connector) and/or a switch (e.g. a mechanical switch) in testing the first capacitive coupling structure 306-1 (e.g. antenna coupling element) and/or the chip 302.

An effect (e.g. an additional effect) provided by the semiconductor device 600 shown in FIG. 6 may be a substantial reduction or elimination of resistive and/or dielectric loss in a test interface.

An effect (e.g. an additional effect) provided by the semiconductor device 600 shown in FIG. 6 may be reduction in cost of testing the first capacitive coupling structure 306-1 (e.g. antenna coupling element) and/or the chip 302, for example, since a use of a test connector (e.g. a coaxial connector) and/or a switch (e.g. a mechanical switch) may be avoided.

Loss (e.g. dielectric loss) in at least one of the semiconductor devices 300, 301, and 600 may be further reduced by means of an air gap.

Figure 7:
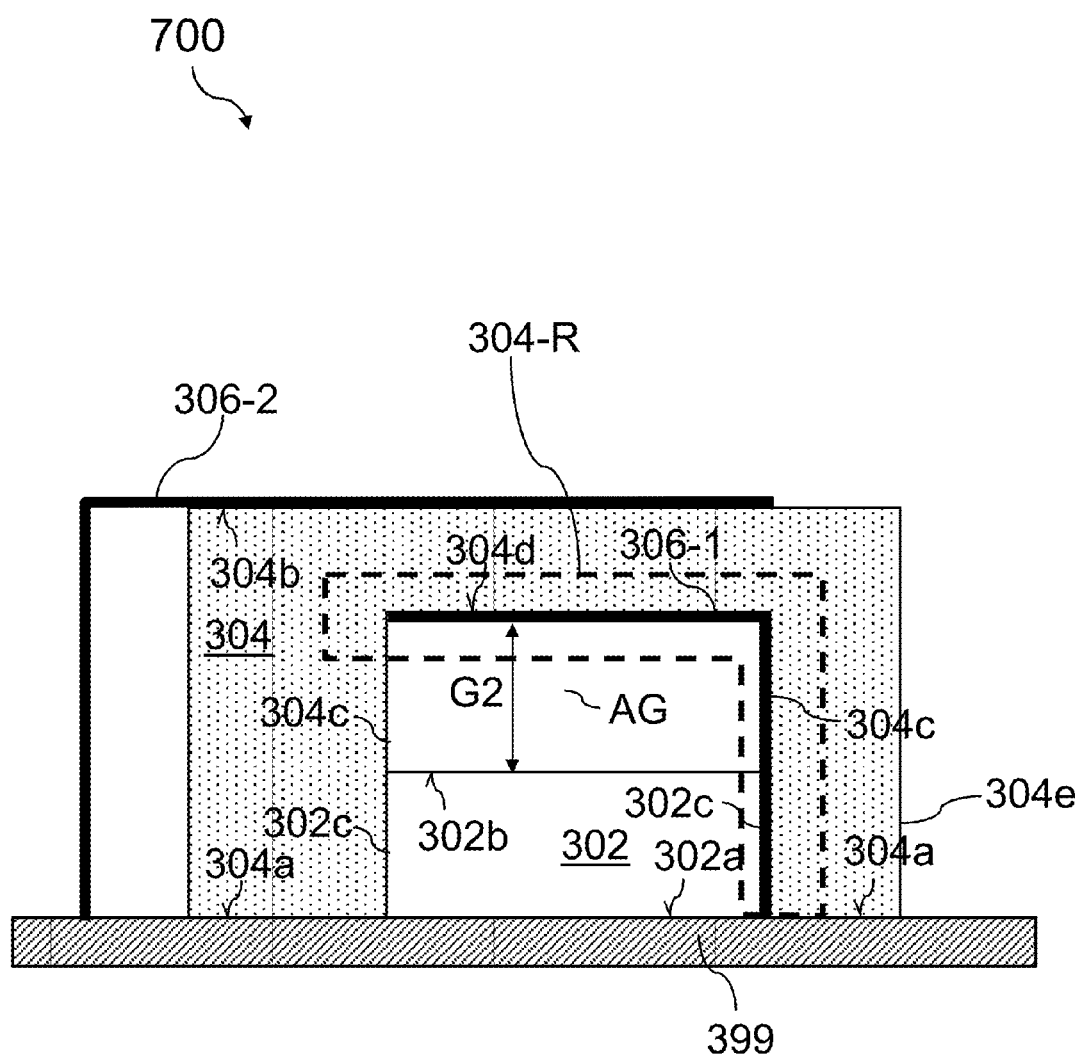
FIG. 7 shows a cross-sectional view of a semiconductor device including an air gap.

FIG. 7 shows a cross-sectional view of a semiconductor device 700 including an air gap AG.

The semiconductor device 700 shown in FIG. 7 may, for example, be the semiconductor device 300 provided with an air gap AG between the chip 302 and the first capacitive coupling structure 306-1, e.g. between the second side 302b of the chip 302 and the part 306-1a (e.g. coupling plate) of the first capacitive coupling structure 306-1.

Reference signs in FIG. 7 that are the same as in FIG. 3A and/or FIG. 3B denote the same or similar elements as in FIG. 3A and/or FIG. 3B. Thus, those elements will not be described in detail again here; reference is made to the description above. The various effects described above in relation to the semiconductor devices shown in FIG. 3A and/or FIG. 3B may be analogously valid for the semiconductor device 700 shown in FIG. 7. Differences between FIG. 7 and FIG. 3A and/or FIG. 3B are described below.

As shown in FIG. 7, the semiconductor device 700 may include an air gap AG that may, for example, be enclosed by the chip packaging structure 304. In this regard, the chip packaging structure 304 may include a sidewall 304c (e.g. an inner side wall) and a side 304d (e.g. an inner side, for example, an inner ceiling) that may face the chip 302. For example, in the semiconductor device 700 shown in FIG. 7, the side 304d may face the second side 302b (e.g. backside) of the chip 302.

In the semiconductor device 700 shown in FIG. 7, the receiving region 304-R of the chip packaging structure 304 may include the side 304d (e.g. an inner side, for example, an inner ceiling) of the chip packaging structure 304 that may face the chip 302 and the sidewall (e.g. inner sidewall) 304c of the chip packaging structure 304.

As described above, the first capacitive coupling structure 306-1 may be disposed in the receiving region 304-R. In this regard, the first capacitive coupling structure 306-1 shown in FIG. 7 may be disposed at the side 304d (e.g. an inner side, for example, an inner ceiling) of the chip packaging structure 304, which may be included in the receiving region 304-R. Accordingly, the air gap AG may be disposed between the first capacitive coupling structure 306-1 and the chip 302 (e.g. the second side 302b of the chip 302).

A height G2 of the air gap AG disposed between the first capacitive coupling structure 306-1 and the chip 302 (e.g. the second side 302b of the chip 302) may, for example, be in the range from about 1 mm to about 10 mm, for example in the range from about 2 mm to about 8 mm, for example in the range from about 4 mm to about 6 mm, for example about 5 mm, although other heights may be possible as well.

As described above, the chip 302 may include, or may be, at least one of a transceiver, an amplifier (e.g. a power amplifier), and a tuner (e.g. an antenna tuner). For example, a transceiver, an amplifier and optionally a tuner may all be included a single chip, i.e. chip 302. Alternatively, one or more of the aforementioned components may be included in individual chips.

Figure 8A:
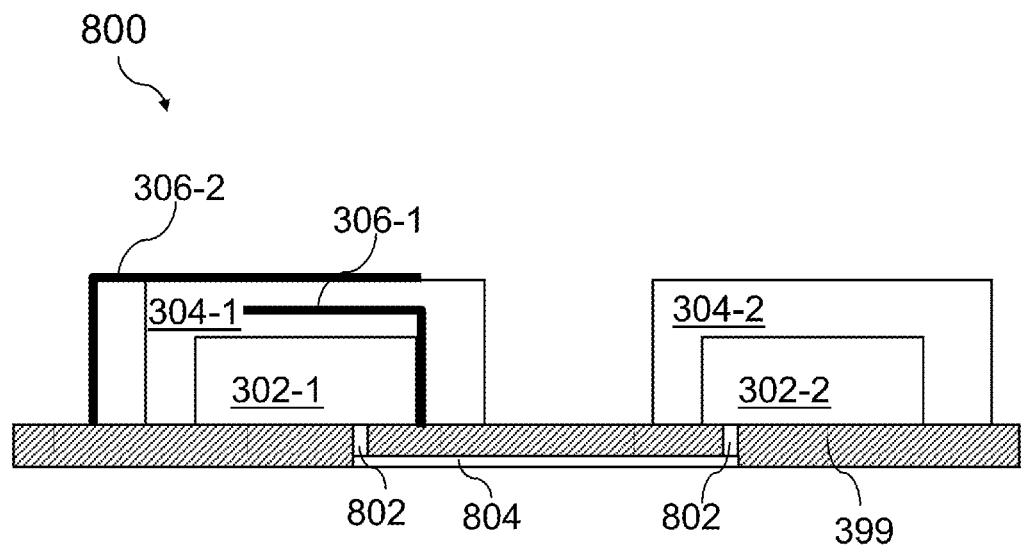
FIG. 8A and FIG. 8B show various views of semiconductor devices, wherein a chip of a semiconductor device may include at least one of an amplifier, a transceiver, and a tuner.

FIG. 8A shows a semiconductor device 800 including a first chip 302-1, which may include or be an amplifier, and further including a second chip 302-2, which may include or be a transceiver, wherein each of the chips 302-1, 302-2 may be at least partially encapsulated by a respective chip packaging structure 304-1, 304-2, and wherein the first and second capacitive coupling structures 306-1, 306-2 may be provided at the chip packaging structure 304-1 at least partially encapsulating the first chip (amplifier) 302-1.

Reference signs in FIG. 8A that are the same as in FIG. 3A and/or FIG. 3B denote the same or similar elements as in FIG. 3A and/or FIG. 3B. Thus, those elements will not be described in detail again here; reference is made to the description above. The various effects described above in relation to the semiconductor devices shown in FIG. 3A and/or FIG. 3B may be analogously valid for the semiconductor device 800 shown in FIG. 8A. Differences between FIG. 8A and FIG. 3A and/or FIG. 3B are described below.

As shown in FIG. 8A, the first chip (amplifier) 302-1 (e.g. power amplifier) may be connected (e.g. electrically connected) to the second chip (transceiver) 302-2 via at least one through-via 802 (e.g. formed in the carrier 399, e.g. PCB) and/or at least one electrically conductive track 804 (e.g. formed at a surface of the carrier 399, e.g. PCB). For example, the at least one electrically conductive track 804 may be printed on the surface of the carrier 399, e.g. PCB.

Figure 8B:
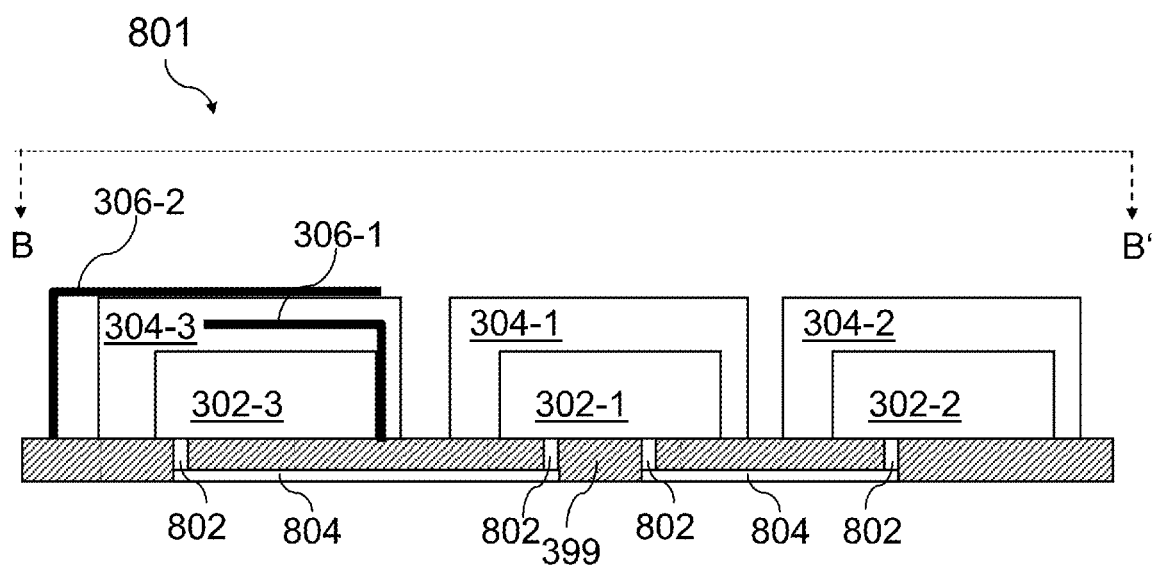

FIG. 8B shows a semiconductor device 801 wherein the chip 302 may include a first chip (including an amplifier) 302-1, a second chip (including a transceiver) 302-2, and a third chip (including a tuner) 302-3, each of which may be at least partially encapsulated by a respective chip packaging structure 304-1, 304-2, 304-3, and wherein the first and second capacitive coupling structures 306-1, 306-2 may be provided at the chip packaging structure 304-3 at least partially encapsulating the third chip (tuner) 302-3.

Reference signs in FIG. 8B that are the same as in FIG. 3A and/or FIG. 3B denote the same or similar elements as in FIG. 3A and/or FIG. 3B. Thus, those elements will not be described in detail again here; reference is made to the description above. The various effects described above in relation to the semiconductor devices shown in FIG. 3A and/or FIG. 3B may be analogously valid for the semiconductor device 801 shown in FIG. 8B. Differences between FIG. 8B and FIG. 3A and/or FIG. 3B are described below.

As shown in FIG. 8B, the first chip (amplifier) 302-1 (e.g. power amplifier), the second chip (transceiver) 302-2, and the third chip (tuner) 302-3 may be connected (e.g. electrically connected) to each other via the at least one through-via 802 (e.g. formed in the carrier 399, e.g. PCB) and/or the at least one electrically conductive track 804 (e.g. formed at a surface of the carrier 399, e.g. PCB). For example, the at least one electrically conductive track 804 may be printed on the surface of the carrier 399, e.g. PCB.

As described above, the semiconductor device may include a plurality of first capacitive coupling structures 306-1 (e.g. antenna coupling elements), and a plurality of second capacitive coupling structures 306-2 (e.g. antennas).

Figure 9:
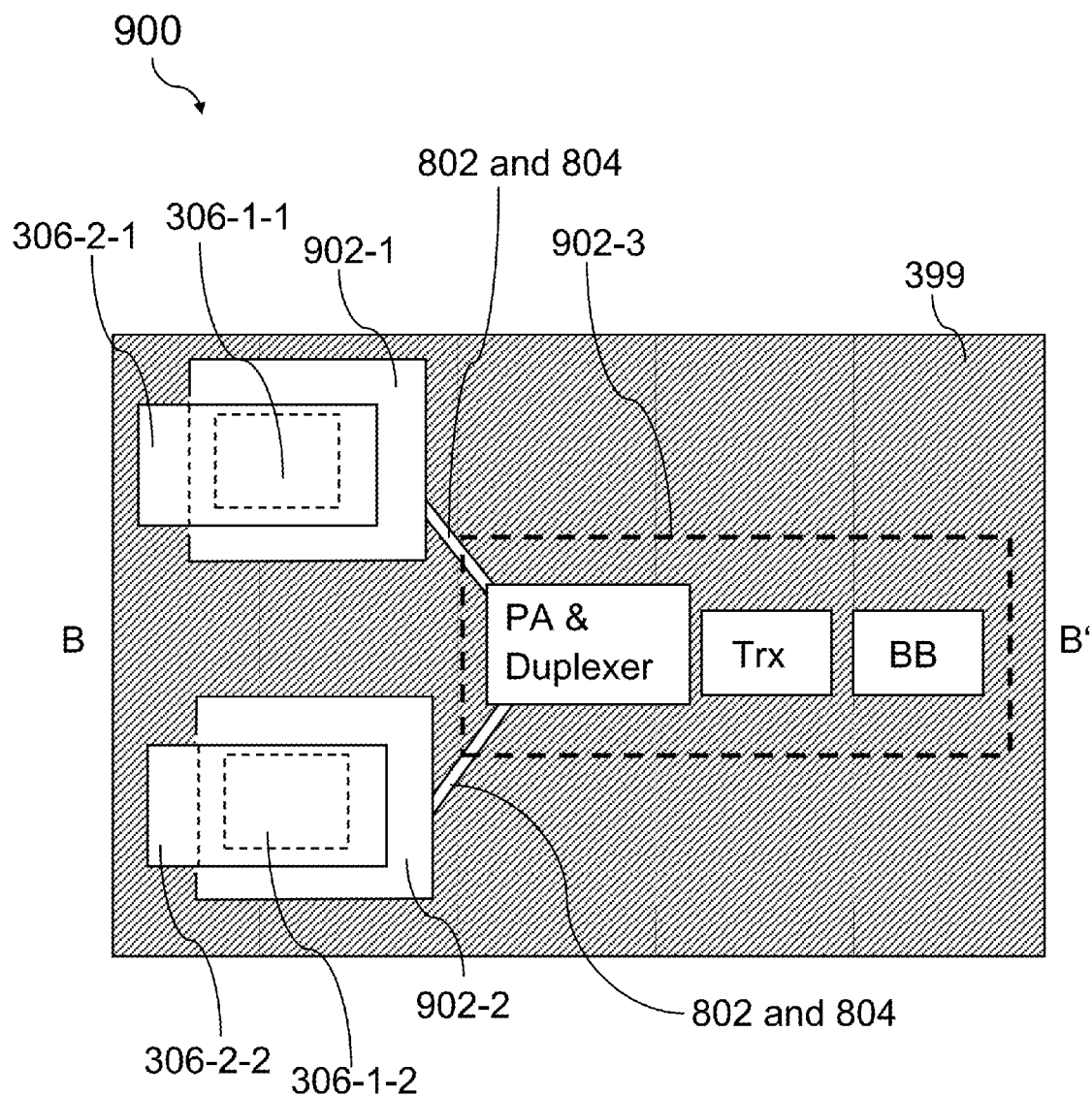
FIG. 9 shows a plan view of to semiconductor device including a first chip, a second chip, a third chip, a plurality of first capacitive coupling structures, and a plurality of second capacitive coupling structures.

FIG. 9 shows a plan view of a semiconductor device 900 including a first chip 902-1, a second chip 902-2, a third chip 902-3, a plurality of first capacitive coupling structures 306-1-1, 306-1-2 and a plurality of second capacitive coupling structures 306-2-1, 306-2-2.

The view of semiconductor device 900 may, for example, correspond to a plan view of the semiconductor device 801 shown in FIG. 8B along the line B-B'.

Reference signs in FIG. 9 that are the same as in FIG. 8B denote the same or similar elements as in 8B. Thus, those elements will not be described in detail again here; reference is made to the description above. The various effects described above in relation to the semiconductor devices shown in 8B may be analogously valid for the semiconductor device 900 shown in FIG. 9. Differences between FIG. 9 and FIG. 8B are described below.

As shown in FIG. 9, the semiconductor device 900 may include a first chip 902-1 and a second chip 902-2. The first chip 902-1 and/or the second chip 902-2 may, for example, be identified with the third chip (tuner) 302-3 shown in FIG. 8B. In other words, the first chip 902-1 and/or the second chip 902-2 may include or may be a tuner (e.g. antenna tuner).

The semiconductor device 900 may include the plurality of first capacitive coupling structures 306-1-1, 306-1-2 provided at the first chip 902-1 and the second chip 902-2. For example, the first capacitive coupling structure 306-1-1 may be provided at the first chip 902-1, and the first capacitive coupling structure 306-1-2 may be provided at the second chip 902-2.

The semiconductor device 900 may include the plurality of second capacitive coupling structures 306-2-1, 306-2-2 disposed over the plurality of first capacitive coupling structures 306-1-1, 306-1-2. For example, the second capacitive coupling structure 306-2-1 may be disposed over the first capacitive coupling structure 306-2-1, and the second capacitive coupling structure 306-2-2 may be disposed over the first capacitive coupling structure 306-2-2.

The arrangement including the second capacitive coupling structure 306-2-1, the first capacitive coupling structure 306-1-1 and the first chip 902-1 may, for example, be identified with the second capacitive coupling structure 306-2, the first capacitive coupling structure 306-1, and the third chip (tuner) 302-3 shown in FIG. 8B.

The semiconductor device 900 may include the third chip 902-3. The third chip 902-3 may, for example, include at least one of an amplifier (e.g. power amplifier), a transceiver, a duplexer, and a base band circuit. For example, in the semiconductor device 900 shown in FIG. 9, the third chip 902-3 may include an amplifier (e.g. power amplifier) (indicated as "PA" in FIG. 9), a transceiver (indicated as "Trx" in FIG. 9), a duplexer and a base band circuit (indicated as "BB" in FIG. 9). The third chip 902-3 may, for example, be identified with the first chip (amplifier) 302-1 (e.g. power amplifier) and/or the second chip (transceiver) 302-2 shown in FIG. 8B. For example, the transceiver Trx in FIG. 9 may be identified with the second chip (transceiver) 302-2 shown in FIG. 8B, and the amplifier PA in FIG. 9 may be identified with the first chip (amplifier) 302-1 shown in FIG. 8B. The power amplifier PA and duplexer, the transceiver Trx, and the base band circuit BB may all be included in the same chip (single-chip concept). However, one or more (e.g. all) of the aforementioned components may alternatively be provided as separate chips.

The third chip 902-3 may be coupled (e.g. electrically coupled) to the first chip 902-1 and the second chip 902-2, for example, via the at least one through-via 802 (e.g. formed in the carrier 399, e.g. PCB) and/or the at least one electrically conductive track 804 (e.g. formed at a surface of the carrier 399, e.g. PCB).

As described above, the first chip 902-1 and/or the second chip 902-2 may be identified with the third chip (tuner) 302-3 shown in FIG. 8B. In other words, the first chip 902-1 and the second chip 902-2 may include, or may be, a first antenna tuner and a second antenna tuner, respectively.

The first chip 902-1 (e.g. first antenna tuner) may be configured to tune in to a first frequency or frequency band, and the second chip 902-2 (e.g. second antenna tuner) may be configured to tune in to a second frequency or frequency band that may be different from the first frequency or frequency band. Accordingly, the first chip 902-1 (e.g. first antenna tuner) and the second chip 902-2 (e.g. second antenna tuner) may, for example, be configured to support multi-frequency reception and/or transmission of a signal.

In another example, the first chip 902-1 (e.g. first antenna tuner) may be configured to tune in to a first frequency or frequency band, and the second chip 902-2 (e.g. second antenna tuner) may be configured to tune in to a second frequency or frequency band that may be identical to the first frequency or frequency band. In such an example, first chip 902-1 (e.g. first antenna tuner) and the second chip 902-2 (e.g. second antenna tuner) may provide transmission and/or reception diversity to a device that may include the semiconductor device 900 shown in FIG. 9. For example, a device that may include the semiconductor device 900 shown in FIG. 9 may be configured for use in a multiple-input multiple-output (MIMO) communications system.

As described above, the chip packaging structure 304 may at least partially encapsulate the chip 302. Accordingly, the chip packaging structure 304 and the chip 302 may, for example, form a chip package.

The chip packaging structure 304 may include, or may be, a flip chip package. By way of another example, the chip packaging structure 304 may include, or may be, a wafer level package (WLP). For example, a lateral extent of the chip packaging structure 304 may be at least substantially equal to a lateral extent of the chip 302. By way of yet another example, the chip packaging structure 304 may include, or may be, an embedded wafer level ball grid array (eWLB) package. For example, a lateral extent of the chip packaging structure 304 may be larger than a lateral extent of the chip 302. For example, the chip packaging structure 304 may include an extension layer that may, for example, extend laterally from at least one side of the chip 302 (e.g. from all sides of the chip 302).

In the description that follows, various examples of an eWLB package that may include the first capacitive coupling structure 306-1 and the second capacitive coupling structure 306-2 are presented. However, the features of the eWLB package may be analogously applicable to a flip chip package, a WLP, or other chip packages.

Figure 10:
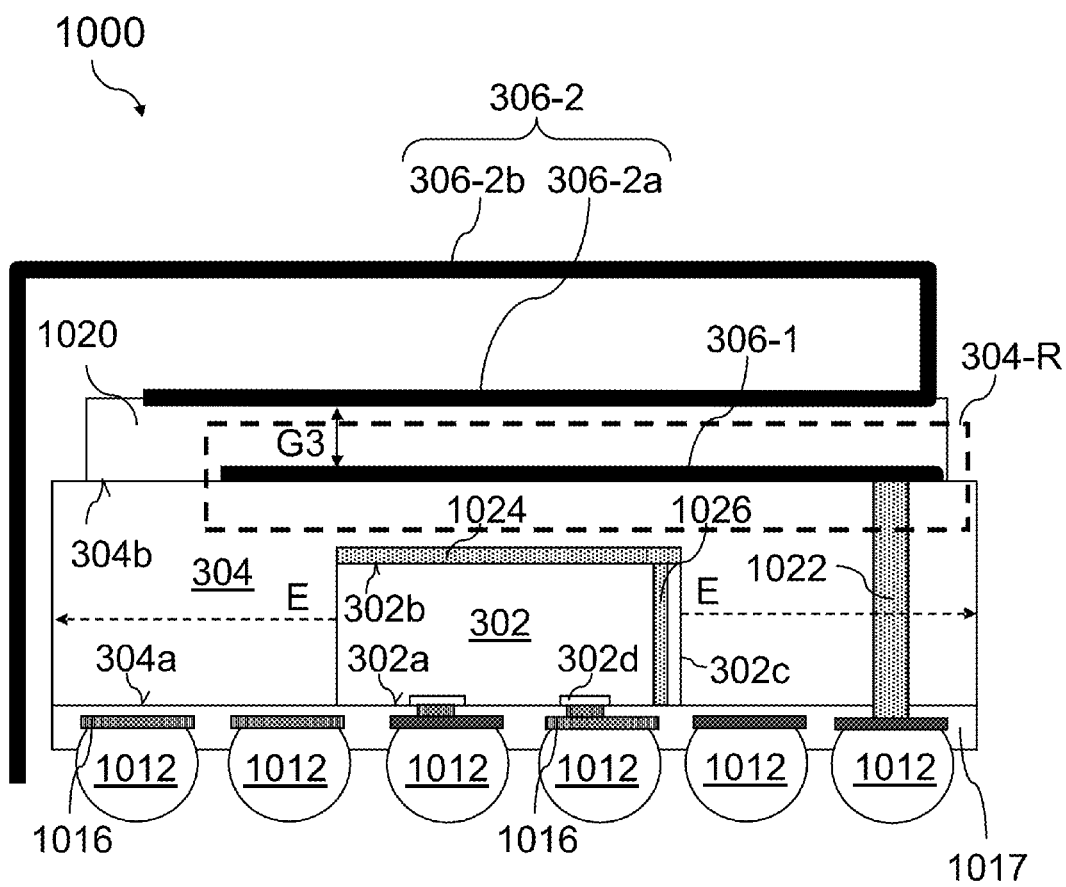
FIG. 10 shows a semiconductor device configured as an embedded wafer level ball grid array (eWLB) package.

FIG. 10 shows a semiconductor device 1000 configured as an embedded wafer level ball grid array (eWLB) package.

Reference signs in FIG. 10 that are the same as in FIG. 3A and/or FIG. 3B denote the same or similar elements as in FIG. 3A and/or FIG. 3B. Thus, those elements will not be described in detail again here; reference is made to the description above. The various effects described above in relation to the semiconductor devices shown in FIG. 3A and/or FIG. 3B may be analogously valid for the semiconductor device 1000 shown in FIG. 10. Differences between FIG. 10 and FIG. 3A and/or FIG. 3B are described below.

As shown in FIG. 10, the semiconductor device 1000 may include the chip 302 and the chip packaging structure 304, which may at least partially surround the chip 302.

The chip 302 may include at least one electrically conductive contact 302d (e.g. a pad) that may, for example, provide an interface (e.g. an electrical interface) for the chip 302. In other words, signals (e.g. electrical signals, power supply potentials, ground potentials, etc.) may be exchanged with the chip 302 via the at least one electrically conductive contact 302d. The at least one electrically conductive contact 302d may be disposed at the first side (e.g. front side) 302a of the chip 302.

The semiconductor device 1000 may include a plurality of solder balls 1012. The chip 302 may be electrically connected to at least one solder ball of the plurality of solder balls 1012 by means of a redistribution layer (RDL) 1016. For example, the RDL 1016 may be electrically connected to the at least one electrically conductive contact 302d of the chip 302. The RDL 1016 may, for example, be partially or fully disposed within an insulating layer 1017 (e.g. a dielectric layer and/or a solder stop layer). The RDL 1016 may redistribute and/or re-map electrical connections from the chip 302 to the plurality of solder balls 1012.

In the semiconductor device 1000 shown in FIG. 10, the receiving region 304-R may include at least a part of the second side 304b (e.g. backside) of the chip packaging structure 304, which may, for example, face away from the chip 302. Furthermore, as described above, the first capacitive coupling structure 306-1 may be disposed in the receiving region 304-R. In this regard, the first capacitive coupling structure 306-1 may be formed at (e.g. disposed at or over) the second side 304b (e.g. backside) of the chip packaging structure 304, which may, for example, face away from the chip 302. For example, in the semiconductor device 1000 shown in FIG. 10, the first capacitive coupling structure 306-1 may be disposed on the second side 304b (e.g. backside) of the chip packaging structure 304.

The first capacitive coupling structure 306-1 may be formed at (e.g. disposed at or over) the second side 304b (e.g. backside) of the chip packaging structure 304 by means of, for example, a thin-film technology (e.g. a sputtering process and/or a plating process), although other methods of forming the first capacitive coupling structure 306-1 may be possible as well.

The semiconductor device 1000 may include a layer 1020 disposed between the second capacitive coupling structure 306-2 (e.g. antenna) and the first capacitive coupling structure 306-1 (e.g. antenna coupling element).

The second capacitive coupling structure 306-2 (e.g. antenna), which may be capacitively coupled to the first capacitive coupling structure 306-1 (e.g. antenna coupling element), may be attached to the first capacitive coupling structure 306-1 (e.g. antenna coupling element) by means of an adhesive (e.g. a polymer adhesive). In this regard, the layer 1020 may include, or may be, an adhesive layer. The adhesive layer may include, or may be, a film adhesive (e.g. a dry film adhesive, e.g. an epoxy dry film adhesive).

As described above, the second capacitive coupling structure 306-2 (e.g. antenna), may be capacitively coupled to the first capacitive coupling structure 306-1 (e.g. antenna coupling element). The capacitive coupling between the second capacitive coupling structure 306-2 (e.g. antenna) and the first capacitive coupling structure 306-1 (e.g. antenna coupling element) may be calibrated (e.g. tuned) by providing a dielectric layer that may be disposed between the second capacitive coupling structure 306-2 (e.g. antenna) and the first capacitive coupling structure 306-1 (e.g. antenna coupling element). Accordingly, the layer 1020 disposed between the second capacitive coupling structure 306-2 (e.g. antenna) and the first capacitive coupling structure 306-1 (e.g. antenna coupling element) may include, or may be, a dielectric layer.

The capacitive coupling between the second capacitive coupling structure 306-2 (e.g. antenna) and the first capacitive coupling structure 306-1 (e.g. antenna coupling element) may be calibrated (e.g. tuned) by adjusting a distance G3 between the second capacitive coupling structure 306-2 (e.g. antenna) and the first capacitive coupling structure 306-1 (e.g. antenna coupling element). Accordingly, the layer 1020 may, for example, ensure that a constant distance G3 may be maintained between the first capacitive coupling structure 306-1 (e.g. antenna coupling element) and the second capacitive coupling structure 306-2 (e.g. antenna).

As described above, the chip packaging structure 304 (e.g. eWLB package) may include an extension layer E that may, for example, extend laterally from at least one side of the chip 302 (e.g. from all sides of the chip 302). As shown in FIG. 10, the extension layer E may be an extension of the chip 302 and may sometimes also be referred to as chip extension or reconstitution layer. The extension layer E may include, or may consist of, a material different from the chip 302, for example a packaging material, e.g. a chip packaging material. For example, the extension layer E may include, or may consist of, a molding material (e.g. a mold compound).

The chip packaging structure 304 may include at least one through-via 1022 that may be formed in the extension layer E. In an example where the extension layer E of the chip packaging structure 304 includes, or consists of, a molding material (e.g. a mold compound), the at least one through-via 1022 may be referred to as a through-mold via (TMV).

The at least one through-via 1022 may extend from the first side 304a (e.g. frontside) of the chip packaging structure 304 to the second side 304b (e.g. backside) of the chip packaging structure 304. The at least one through-via 1022 may couple (e.g. electrically couple) the chip 302 and the first capacitive coupling structure 306-1. For example, the at least one through-via 1022 may be coupled to the first capacitive coupling structure 306-1, e.g. at the second side 304b (e.g. backside) of the chip packaging structure 304, and may be coupled to the chip 302 (e.g. via the RDL 1016), thus coupling the chip 302 and the first capacitive coupling structure 306-1.

The at least one through-via 1022 may, for example, include, or may consist of, at least one electrically conductive material, e.g. a metal and/or metal alloy. The at least one electrically conductive material may be selected from a group of electrically conductive materials, the group consisting of: aluminum, copper, and gold, although other electrically conductive materials may be possible as well.

As described above in respect of FIG. 3A, a shielding structure may be provided in the semiconductor device in order to avoid interference (e.g. radio-frequency and/or electromagnetic interference) between the chip 302 and the second capacitive coupling structure 306-2 (e.g. antenna, e.g. radiating and/or receiving antenna) and/or the first capacitive coupling structure 306-1 (e.g. antenna coupling element). In other words, the chip 302 may be a shielded chip.

The semiconductor device 1000 may include a shielding structure 1024, which may, for example, be disposed between the chip 302 and the first capacitive coupling structure 306-1.

The shielding structure 1024 may be disposed over the second side 302b (e.g. backside) of the chip 302, as shown in FIG. 10.

The shielding structure 1024 may be at least partially embedded in the chip packaging structure 304 (e.g. molding material). For example, at least one side of the shielding structure 1024 may be enclosed by the chip packaging structure 304 (e.g. molding material). In the example shown in FIG. 10, at least one sidewall (e.g. all sidewalls) of the shielding structure 1024 and/or a surface of the shielding structure 1024 facing away from the chip 302 may be enclosed by the chip packaging structure 304.

The shielding structure 1024 may include, or may consist of, a metal or a metal alloy. For example, the shielding structure 1024 may include, or may consist of, copper or a copper alloy. By way of another example, the shielding structure 1024 may include, or may consist of, aluminum or an aluminum alloy.

The shielding structure 1024 may include, or may be, a metallization layer. For example, in the semiconductor device 1000 shown in FIG. 10, the shielding structure 1024 disposed over the second side 302b (e.g. backside) of the chip 302 may include, or may be, a metallization layer (e.g. backside metallization) of the chip 302.

The shielding structure 1024 may, for example, be coupled (e.g. electrically coupled) to the chip 302. For example, in the semiconductor device 1000 shown in FIG. 10, the chip 302 may include at least one through-via 1026. In an example where the chip 302 may include, or may consist of, silicon, the at least one through-via 1026 may be referred to as a through-silicon via (TSV).

The at least one through-via 1026 may, for example, extend from the first side 302a of the chip 302 to the second side 302a of the chip 302. The at least one through-via 1026 may be electrically coupled to the shielding structure 1024 (e.g. at the second side 302b of the chip 302 as shown in FIG. 10), and may be electrically coupled to the at least one electrically conductive contact 302d of the chip 302, thus electrically coupling the shielding structure 1024 to the chip 302.

Figure 11:
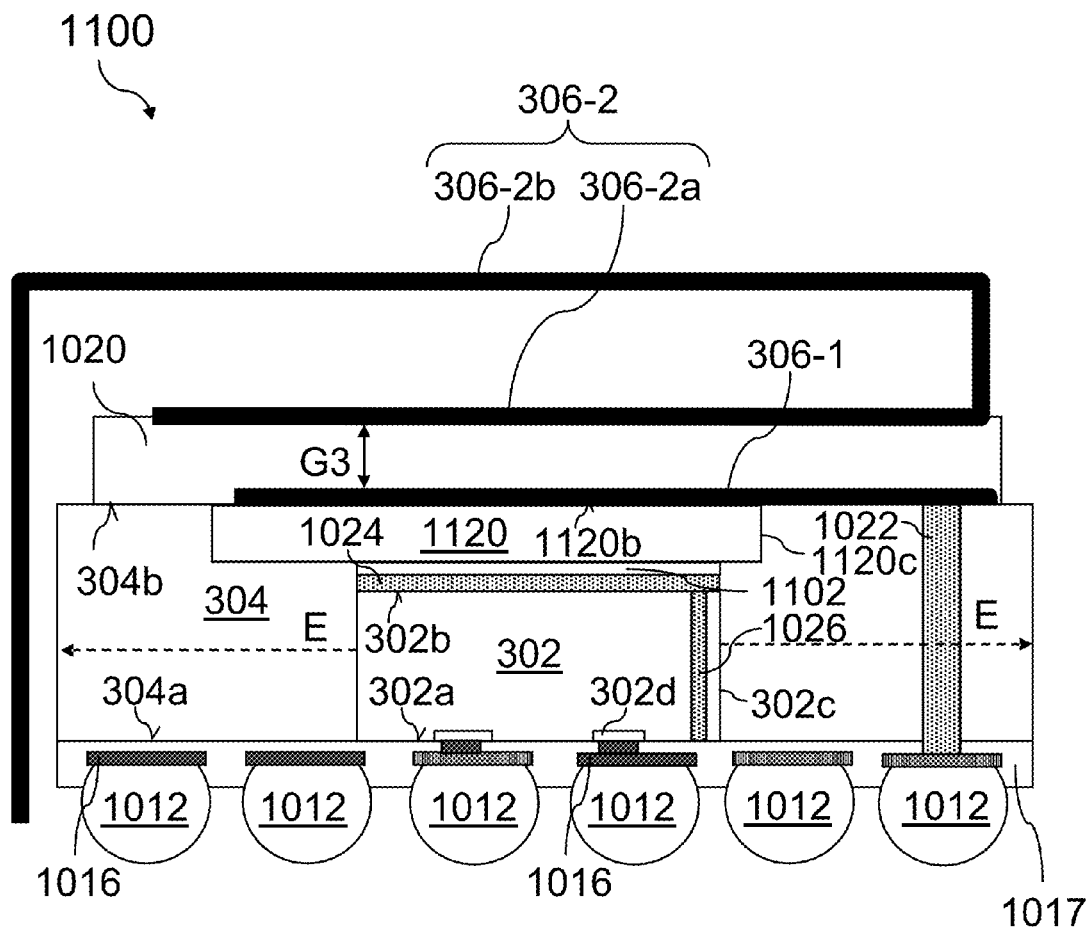
FIG. 11 shows a semiconductor device including a dielectric layer disposed between a shielding structure and a first capacitive coupling structure.

FIG. 11 shows a semiconductor device 1100 including a dielectric layer 1120 disposed between the shielding structure 1024 and the first capacitive coupling structure 306-1.

Reference signs in FIG. 11 that are the same as in FIG. 10 denote the same or similar elements as in FIG. 10. Thus, those elements will not be described in detail again here; reference is made to the description above. The various effects described above in relation to the semiconductor devices shown in FIG. 10 may be analogously valid for the semiconductor device 1100 shown in FIG. 11. Differences between FIG. 11 and FIG. 10 are described below.

The shielding of the chip 302, for example, against radio-frequency and/or electromagnetic interference may be enhanced by providing the dielectric layer 1120, which may be disposed between the shielding structure 1024 and the first capacitive coupling structure 306-1.

As shown in FIG. 11, the dielectric layer 1120 may be at least partially embedded in the chip packaging structure 304. For example, the dielectric layer 1120 may include at least one sidewall 1120c, and may be enclosed from at least one sidewall 1120c (e.g. all sidewalls) by the chip packaging structure 304. The dielectric layer 1120 may include a side 1120b that may face away from the chip 302. In the semiconductor device 1100 shown in FIG. 11, the side 1120b may be at least substantially flush with the second side 304b of the chip packaging structure 304. In another example, the chip packaging structure 304 may be disposed over the side 1120b of the dielectric layer 1120. In such an example, the dielectric layer 1120 may be fully embedded in the chip packaging structure 304.

The dielectric layer 1120 may include, or may consist of, a high-k dielectric material (e.g. a material having a dielectric constant higher than that of silicon oxide). For example, the dielectric layer 1120 may include, or may consist of, a ceramic material. The dielectric layer 1120 may cover an entire upper surface of the shielding structure 1024. The dielectric layer 1120 may extend laterally beyond the shielding structure 1024, e.g. beyond one or more (e.g. all) sidewalls 302c of the chip 302, as shown.

The dielectric layer 1120 may, for example, be formed by means of a molding process. For example, the dielectric layer 1120 may be molded into the chip packaging structure 304 (e.g. mold compound). For example, the dielectric layer 1120 (e.g. including or consisting of a ceramic material) may be molded into (e.g. embedded in) the chip packaging structure 304 by means of a mold chase (e.g. a top mold chase).

In the example described above, the dielectric layer 1120 may be formed after or as part of forming the chip packaging structure 304. In another example, the chip packaging structure 304 may be formed after attaching the dielectric layer 1120 to the chip 302 (e.g. to the second side 302b of the chip 302). For example, the dielectric layer 1120 may be attached to the chip 302 (e.g. to the second side 302b of the chip 302) by means of an adhesive layer 1102 (e.g. including or consisting of glue).

In the example shown in FIG. 11, the first capacitive coupling structure 306-1 may be formed at (e.g. disposed at or over) the second side 304b (e.g. backside) of the chip packaging structure 304 and the dielectric layer 1120 by means of, for example, a thin-film technology (e.g. a sputtering process and/or a plating process), although other methods of forming the first capacitive coupling structure 306-1 may be possible as well.

Figure 12:
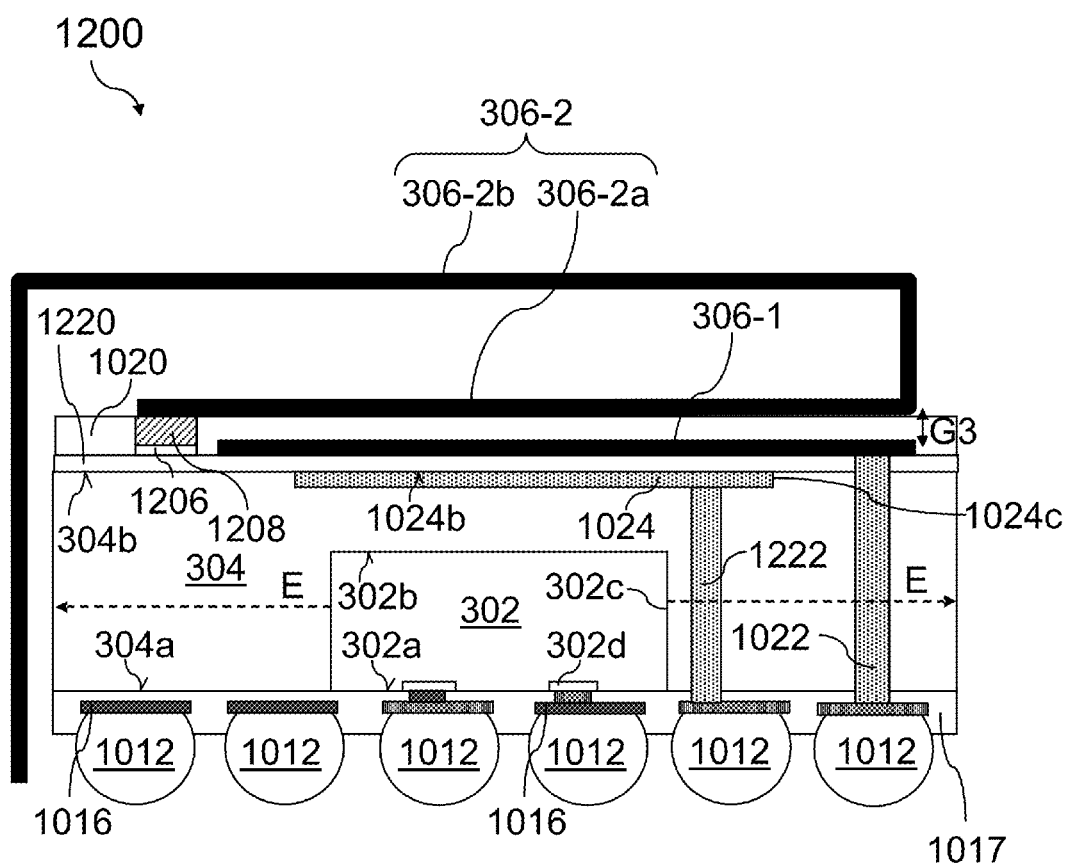
FIG. 12 shows a semiconductor device including a shielding structure formed at a side of a chip packaging structure.

FIG. 12 shows a semiconductor device 1200 including the shielding structure 1024 formed at the second side 304b of the chip packaging structure 304.

Reference signs in FIG. 12 that are the same as in FIG. 10 denote the same or similar elements as in FIG. 10. Thus, those elements will not be described in detail again here; reference is made to the description above. The various effects described above in relation to the semiconductor devices shown in FIG. 10 may be analogously valid for the semiconductor device 1200 shown in FIG. 12. Differences between FIG. 12 and FIG. 10 are described below.

As shown in FIG. 12, the shielding structure 1024 may not be disposed on the second side 302b of the chip 302 as in FIG. 10, but may be disposed at the second side 304b of the chip packaging structure 304. For example, the shielding structure 1024 shown in FIG. 12 may be disposed at the second side 304b of the chip packaging structure 304, such that the second side 304b may be at least substantially flush with a side 1024b of the shielding structure 1024 facing away from the chip 302. In other words, the shielding structure 1024 may be disposed over (e.g. disposed above) the chip 302 (e.g. the second side 302b of the chip 302).

As shown in FIG. 12, the shielding structure 1024 may be at least partially embedded in the chip packaging structure 304. For example, the shielding structure 1024 may include at least one sidewall 1024c, and may be enclosed from the at least one sidewall 1024c (e.g. all sidewalls) by the chip packaging structure 304. In the semiconductor device 1200 shown in FIG. 12, the side 1024b may be at least substantially flush with the second side 304b of the chip packaging structure 304. In another example, a part of the chip packaging structure 304 may be disposed over the side 1024b of the shielding structure 1024. In such an example, the shielding structure 1024 may be fully embedded in the chip packaging structure 304.

The shielding structure 1024 may include, or may be, a redistribution layer. As described above, the side 304b of the chip packaging structure 304 may, for example, be a backside of the chip packaging structure 304. Accordingly, the shielding structure 1024 disposed at the second side 304b of the chip packaging structure 304 may include, or may be, a backside redistribution layer.

The shielding structure 1024 shown in FIG. 12 may, for example, be formed by means of a molding process. For example, the shielding structure 1024 may be molded into the chip packaging structure 304 (e.g. mold compound), e.g. after forming the chip packaging structure 304. For example, the shielding structure 1024 (e.g. metal, e.g. metal film) may be dispensed by means of a mold chase (e.g. a top mold chase) into the chip packaging structure 304.

In the example described above, the shielding structure 1024 may be formed after or as part of forming the chip packaging structure 304. In another example, the chip packaging structure 304 may be formed after attaching the shielding structure 1024 to the chip 302 (e.g. to the second side 302b of the chip 302). For example, the shielding structure 1024 may be attached to the chip 302 (e.g. to the second side 302b of the chip 302) by means of an adhesive layer (e.g. including or consisting of glue) that may be disposed between the chip 302 and the shielding structure 1024 (not shown in FIG. 12).

The extension layer E may include at least one through-via 1222 that may, for example, extend from the first side 304a of the chip packaging structure 304 to the shielding structure 1024. In an example where the extension layer E may include, or may consist of, a molding material (e.g. a mold compound), the at least one through-via 1222 may be referred to as a through-mold via (TMV). The at least one through-via 1222 may be coupled (e.g. electrically coupled) to the shielding structure 1024.

The at least one through-via 1222 may be coupled (e.g. electrically coupled) to the RDL 1016, which may in turn be coupled (e.g. electrically coupled) to at least one solder ball of the plurality of solder balls 1012 and/or to the chip 302 (e.g. to the at least one electrically conductive contact 302d of the chip 302). Accordingly, the shielding structure 1024 may be electrically coupled to the chip 302 (e.g. via the at least one through-via 1222 and the RDL 1016).

As shown in FIG. 12, the first capacitive coupling structure 306-1 may be formed over the second side 304b of the chip packaging structure 304. In other words, the first capacitive coupling structure 306-1 may be disposed over the second side 304b of the chip packaging structure 304. In such an example, the at least one through-via 1022 (which may be electrically coupled to the first capacitive coupling structure 306-1) may, for example, extend past the second side 304b of the chip packaging structure 304 to the first capacitive coupling structure 306-1.

The first capacitive coupling structure 306-1 shown in FIG. 12 may be formed over the second side 304b (e.g. backside) of the chip packaging structure 304 by means of, for example, a thin-film technology (e.g. a sputtering process and/or a plating process), although other methods of forming the first capacitive coupling structure 306-1 may be possible as well. For example, the first capacitive coupling structure 306-1 may be applied (e.g. by means of a thin-film technology) over a dielectric layer 1220 that may, for example, be disposed over the second side 304b of the chip packaging structure 304 and between the shielding structure 1024 and the first capacitive coupling structure 306-1. The dielectric layer 1220 disposed between the shielding structure 1024 and the first capacitive coupling structure 306-1 may electrically insulate the first capacitive coupling structure 306-1 (e.g. antenna coupling element) from the shielding structure 1024.

The dielectric layer 1220 may include, or may consist of, a material that may be different from the chip packaging structure 304. The dielectric layer 1220 may include, or may consist of, a polymer material.

The second capacitive coupling structure 306-2 (e.g. antenna) may be coupled (e.g. electrically coupled) to a contact 1206 that may be formed at (e.g. disposed at or over) the dielectric layer 1220. The contact 1206 may be electrically insulated from the first capacitive coupling structure 306-1 by the layer 1020, which may be a dielectric layer (e.g. polymer layer). The coupling to the contact 1206 may be achieved by a coupling layer 1208 disposed between the contact 1206 and the second capacitive coupling structure 306-2, which may include or consist of solder and/or glue, although other materials may be possible as well.

The layer 1020 (e.g. polymer layer) may be disposed between the second capacitive coupling structure 306-2 and the first capacitive coupling structure 306-1 and may ensure that the constant distance G3 is maintained between the first capacitive coupling structure 306-1 (e.g. antenna coupling element) and the second capacitive coupling structure 306-2 (e.g. antenna).

Figure 13:
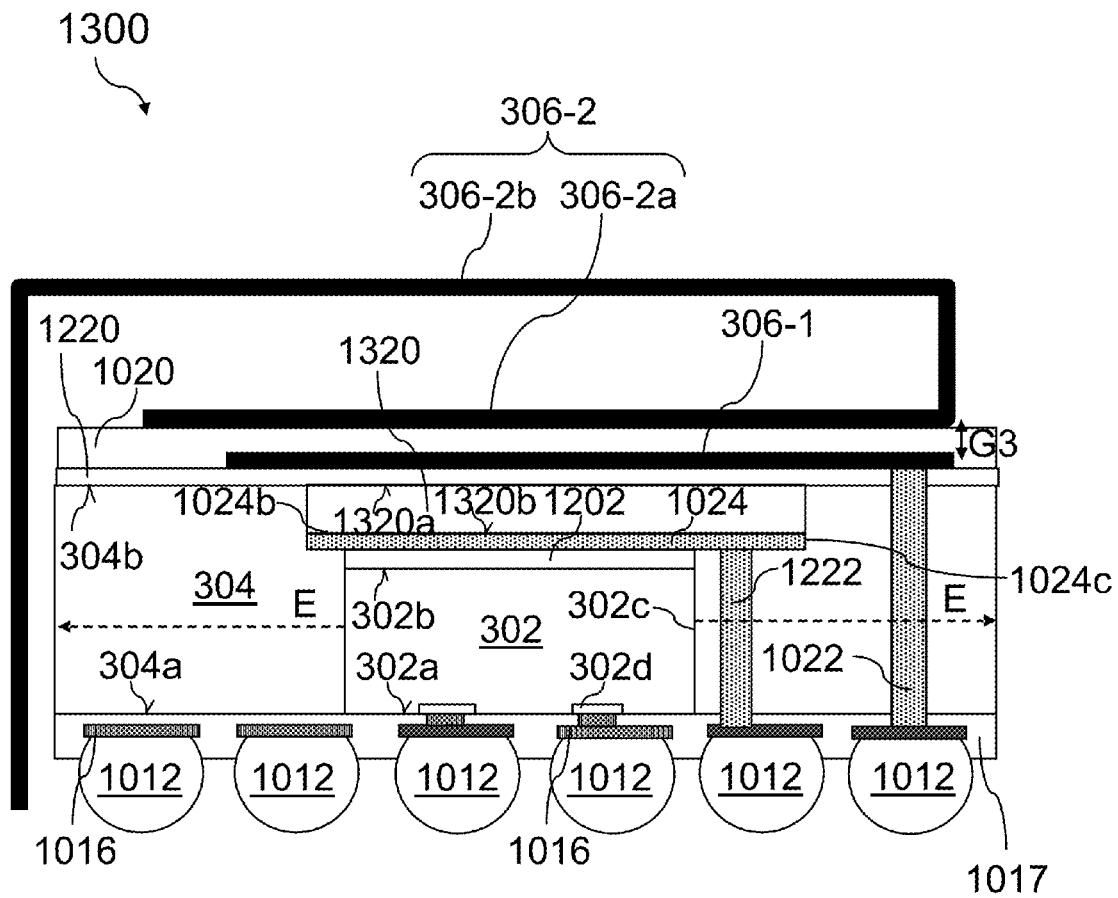
FIG. 13 shows a semiconductor device including a dielectric layer and a shielding structure formed at a side of the dielectric layer.

FIG. 13 shows a semiconductor device 1300 including a dielectric layer 1320, wherein the shielding structure 1024 may be formed at a side of the dielectric layer 1320.

Reference signs in FIG. 13 that are the same as in FIG. 12 denote the same or similar elements as in FIG. 12. Thus, those elements will not be described in detail again here; reference is made to the description above. The various effects described above in relation to the semiconductor devices shown in FIG. 12 may be analogously valid for the semiconductor device 1300 shown in FIG. 13. Differences between FIG. 13 and FIG. 12 are described below.

As shown in FIG. 13, the semiconductor device 1300 may include a dielectric layer 1320 that may have a first side 1320a and a second side 1320b opposite the first side 1320a. The first side 1320a may include, or may be, a frontside of the dielectric layer 1320. The second side 1320b may include, or may be, a backside of the dielectric layer 1320. The second side 1320b of the dielectric layer may face the second side 302b of the chip 302.

The dielectric layer 1320 disposed between the shielding structure 1024 and the first capacitive coupling structure 306-1 may, for example, enhance the shielding of the chip 302, for example, against radio-frequency and/or electromagnetic interference.

The dielectric layer 1320 may include, or may consist of, a material that may be different from the chip packaging structure 304. The dielectric layer 1320 may include, or may consist of, a high-k dielectric material (e.g. a material having a dielectric constant higher than that of silicon oxide). For example, the dielectric layer 1320 may include, or may consist of, a ceramic material.

The shielding structure 1024 may, for example, be formed at (e.g. disposed at or over) the second side 1320b (e.g. backside) of the dielectric layer 1320. For example, the shielding structure 1024 may include, or may be, a metallization layer (e.g. a backside metallization layer) of the dielectric layer 1320.

The dielectric layer 1320 having the shielding structure 1024 (e.g. metallization layer) formed at its second side 1320b (e.g. backside) may be attached to the chip 302 (e.g. to the second side 302b of the chip 302) by means of the adhesive layer 1202 (e.g. including or consisting of glue). This may be performed prior to forming the chip packaging structure 304. In other words, forming the chip packaging structure 304 (e.g. by means of a molding process) may be performed after the dielectric layer 1320 having the shielding structure 1024 (e.g. metallization layer) is attached to the chip 302 (e.g. by means of the adhesive layer 1202).

The shielding structure 1024 (e.g. metallization layer) formed at the second side 1302b (e.g. backside) of the dielectric layer 1302 may be contacted (e.g. electrically contacted) by means of the at least one through-via 1222.

Figure 14:
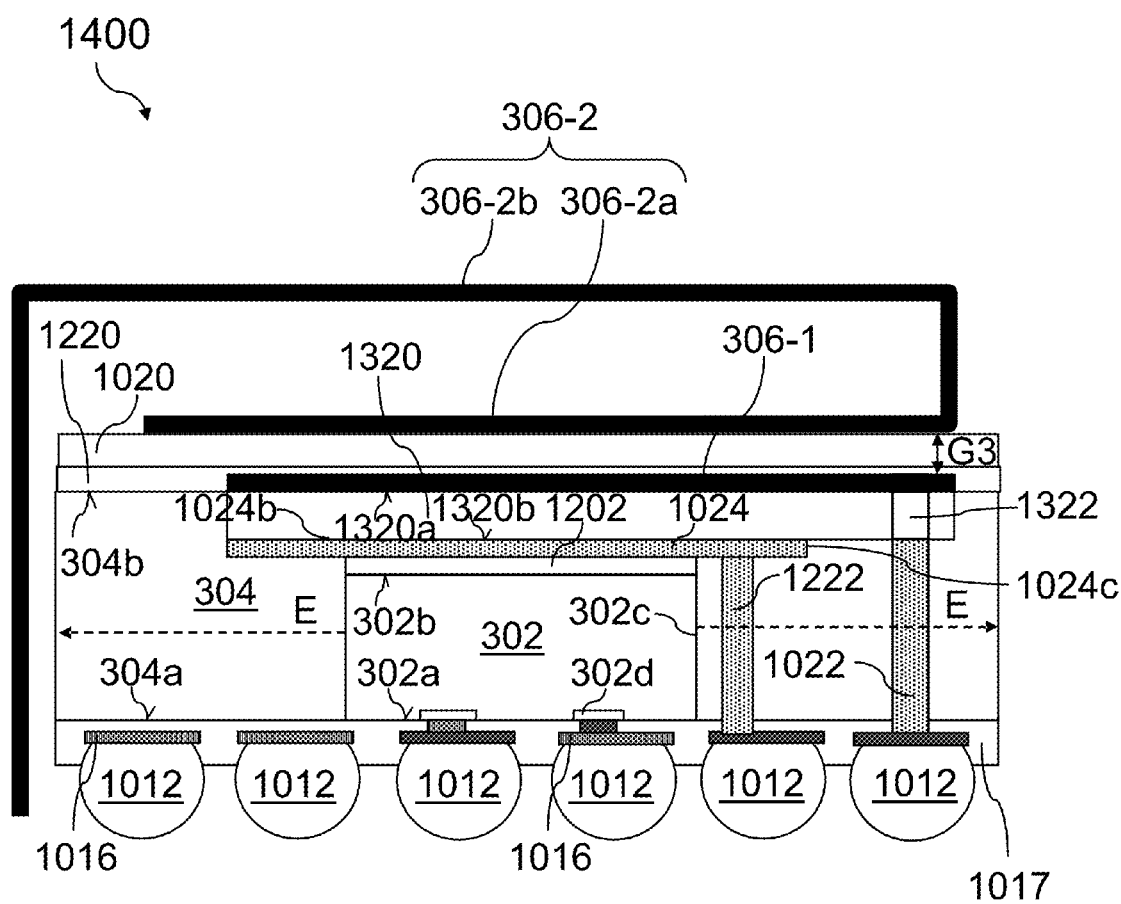
FIG. 14 shows a semiconductor device including a dielectric layer, a shielding structure, and a first capacitive coupling structure, wherein the shielding structure may be formed at a side of the dielectric layer, and wherein the first capacitive coupling structure may be formed at another side of the dielectric layer.

FIG. 14 shows a semiconductor device 1400 including a dielectric layer 1320, wherein the shielding structure 1024 may be formed at a first side of the dielectric layer 1320 and wherein the first capacitive coupling structure 306-1 may be formed a second side of the dielectric layer 1320 opposite the first side of the dielectric layer 1320.

Reference signs in FIG. 14 that are the same as in FIG. 13 denote the same or similar elements as in FIG. 13. Thus, those elements will not be described in detail again here; reference is made to the description above. The various effects described above in relation to the semiconductor devices shown in FIG. 13 may be analogously valid for the semiconductor device 1400 shown in FIG. 14. Differences between FIG. 14 and FIG. 13 are described below.

The first capacitive coupling structure 306-1 may, for example, be formed at (e.g. disposed at or over) the first side 1320a (e.g. frontside) of the dielectric layer 1320. For example, the first capacitive coupling structure 306-1 may include, or may be, a metallization layer (e.g. a frontside metallization layer) of the dielectric layer 1320.

The dielectric layer 1320 having the shielding structure 1024 (e.g. metallization layer) formed at its second side 1320b (e.g. backside) and the first capacitive coupling structure 306-1 formed at its first side 1320a (e.g. frontside) may be attached to the chip 302 (e.g. to the second side 302b of the chip 302) by means of the adhesive layer 1202 (e.g. including or consisting of glue). This may be performed prior to forming the chip packaging structure 304. In other words, forming the chip packaging structure 304 (e.g. by means of a molding process) may be performed after the dielectric layer 1320 having the shielding structure 1024 and the first capacitive coupling structure is attached to the chip 302 (e.g. by means of the adhesive layer 1202).

The first capacitive coupling structure 306-1 (e.g. metallization layer) formed at the first side 1302a (e.g. frontside) of the dielectric layer 1302 may be contacted (e.g. electrically contacted) by means of the at least one through-via 1022 and at least one through-via 1322 that may be formed in the dielectric layer 1320. The at least one through-via 1022 may extend from the second side 304a of the chip packaging structure 304 to the second side 1320b of the dielectric layer 1320, and the at least one-through via 1322 may extend from the second side 1320b of the dielectric layer 1320 to the first side 1320a of the dielectric layer 1320 and may be coupled to the at least one through-via 1022 and the first capacitive coupling structure 306-1.

Figure 15:
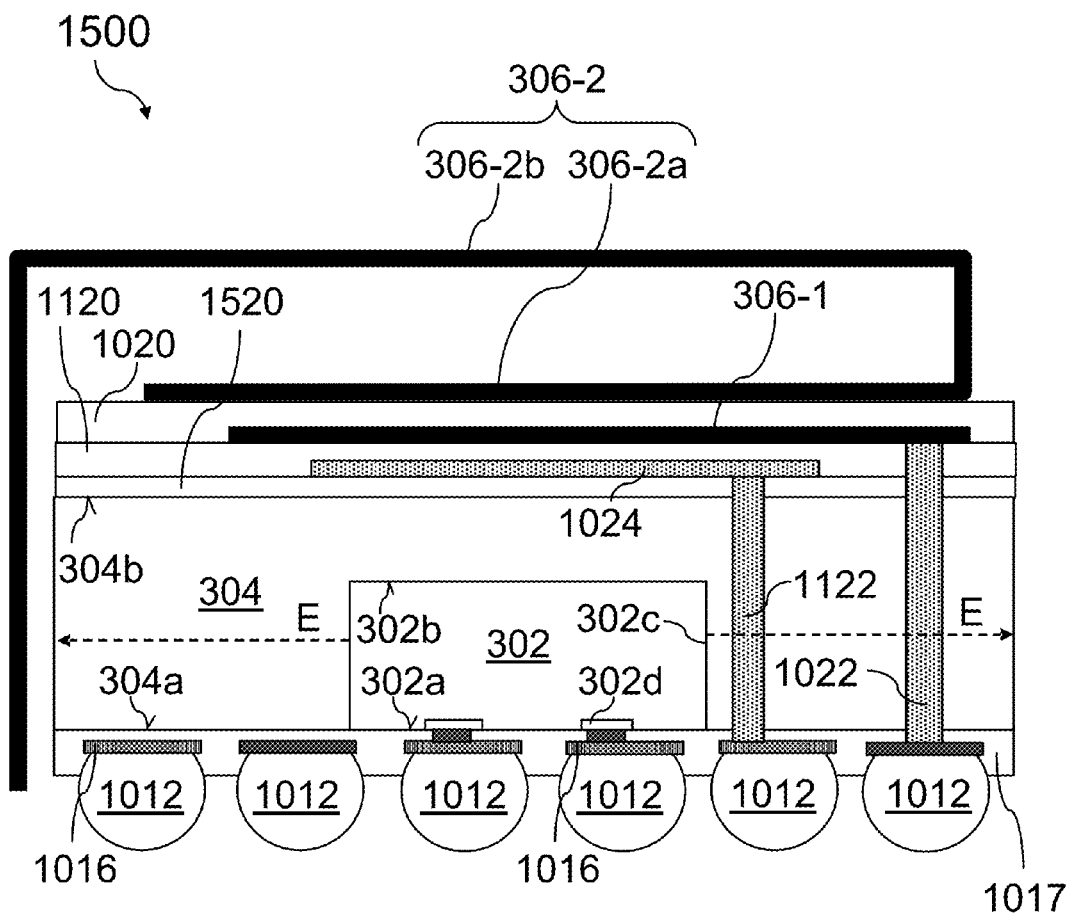
FIG. 15 shows a semiconductor device including a shielding structure formed over a side of the chip packaging structure, wherein a dielectric layer is disposed between the chip packaging structure and the shielding structure.

FIG. 15 shows a semiconductor device 1500 including the shielding structure 1024 formed over the second side 304b of the chip packaging structure 304 and a dielectric layer 1520 disposed between the second side 304b of the chip packaging structure 304 and the shielding structure 1024.

As shown in FIG. 15, the shielding structure 1024 may be formed over the second side 304b of the chip packaging structure 304. For example, the shielding structure 1024 may not be in contact (e.g. physical contact, e.g. direct physical contact) with the chip packaging structure 304.

A dielectric layer 1520 may be disposed between the shielding structure 1024 and the chip packaging structure 304 and may, for example, enhance the shielding of the chip 302, for example, against radio-frequency and/or electromagnetic interference.

The dielectric layer 1520 may include, or may consist of, a material that may be different from the chip packaging structure 304. The dielectric layer 1520 may include, or may consist of, a high-k dielectric material (e.g. a material having a dielectric constant higher than that of silicon oxide). For example, the dielectric layer 1520 may include, or may consist of, a ceramic material.

Figure 16A:
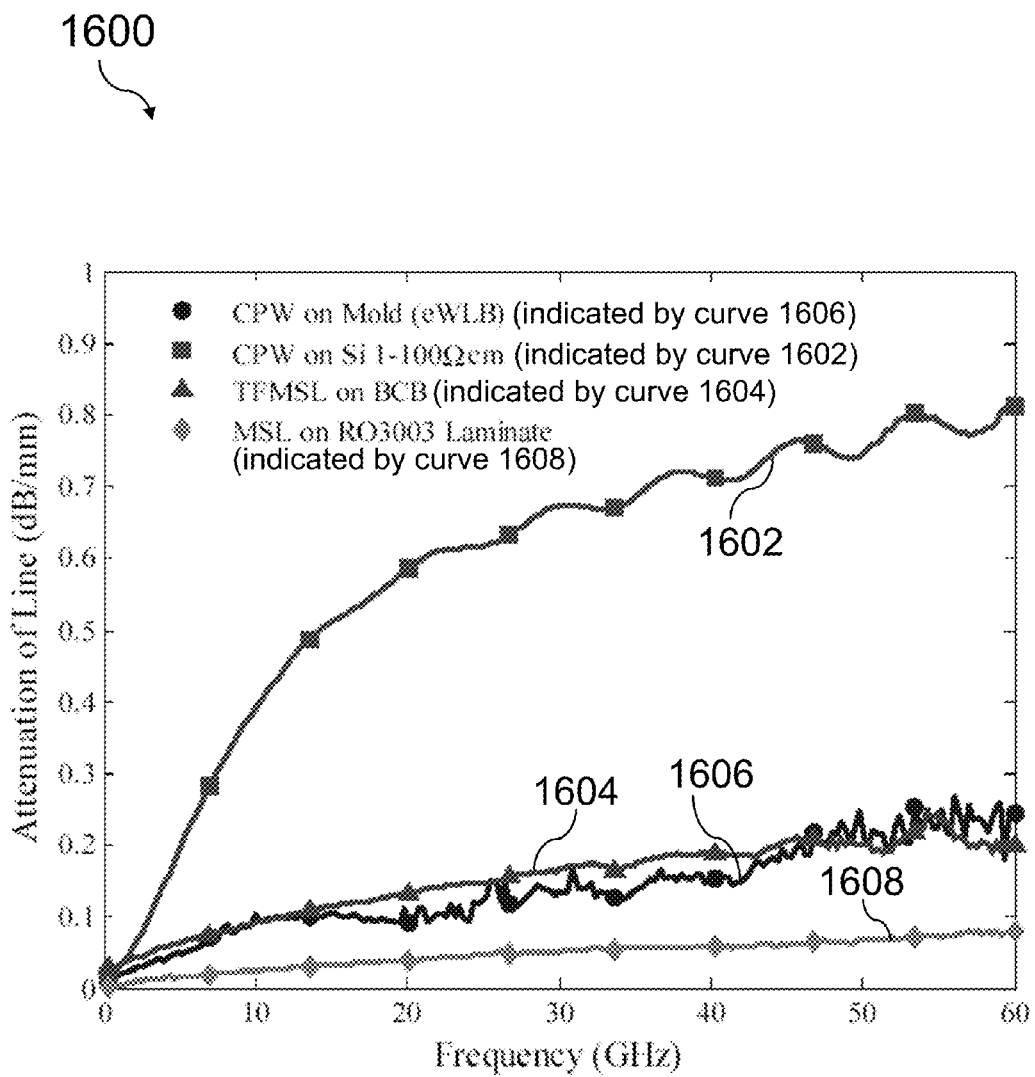
FIG. 16A and FIG. 16B show graphs which illustrate the reduction in loss that may be obtained with a use of any one of, or any combination of, semiconductor devices shown in FIG. 3A to FIG. 15.
Figure 16B:
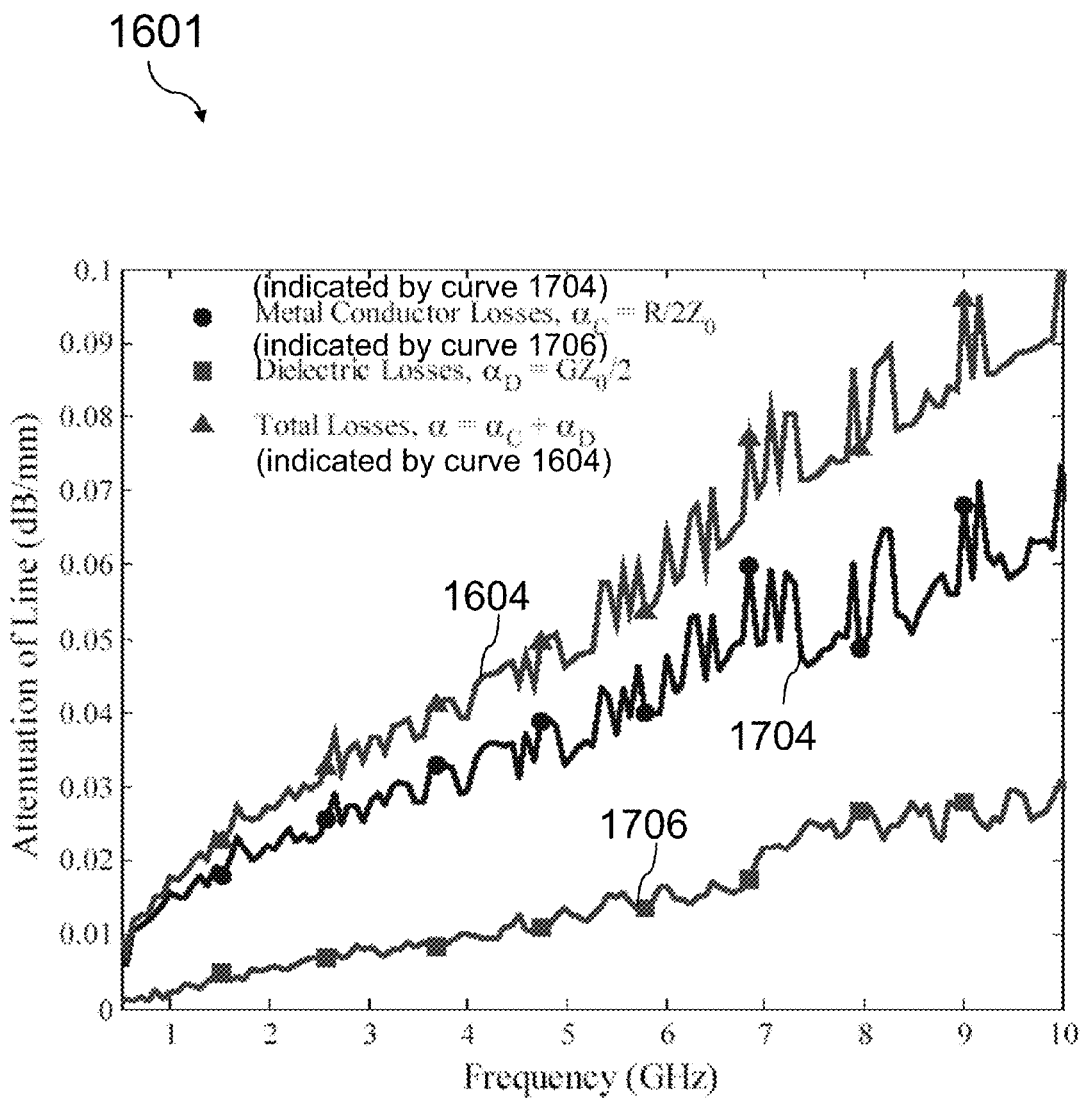

FIG. 16A and FIG. 16B show graphs which illustrate the reduction in loss that may be obtained with a use of any one of, or any combination of, semiconductor devices shown in FIG. 3A to FIG. 15.

FIG. 16A shows a graph 1600 which illustrates an attenuation constant, which may, for example, be represented as an insertion loss of the first capacitive coupling structure 306-1 (indicated as attenuation of line expressed in dB/mm in FIG. 16A). For example, the attenuation constant illustrated in FIG. 16A may show frequency dependent losses of the first capacitive coupling structure 306-1 over different materials.

The first capacitive coupling structure 306-1 may include, or may be, a coplanar waveguide (CPW). For example, the first capacitive coupling structure 306-1 (e.g. CPW) may include, or may be, a CPW formed on or over a molding material (e.g. molding material of an eWLB package). In such an example, the frequency dependent losses of the first capacitive coupling structure 306-1 (e.g. CPW formed on or over the molding material) may be represented by the curve 1606 shown in FIG. 16A. For example, the curve 1606 shows an insertion loss of about 0.1 dB/mm at about 10 GHz and an insertion loss of about 0.25 dB/mm at about 60 GHz for the curve 1606.

By way of another example, the first capacitive coupling structure 306-1 (e.g. CPW) may include, or may be, a CPW formed on or over silicon (e.g. silicon having resistivity in the range from about 1 Ω-cm to about 100 Ω-cm). In such an example, the frequency dependent losses of the first capacitive coupling structure 306-1 (e.g. CPW formed on or over silicon) may be represented by the curve 1602 shown in FIG. 16A.

By way of yet another example, the first capacitive coupling structure 306-1 may include, or may be, a thin-film micro strip line (TFMSL). For example, the first capacitive coupling structure 306-1 (e.g. TFMSL) may include, or may be, a TFMSL formed on or over a dielectric material (e.g. Benzocyclobutene (BCB)). In such an example, the frequency dependent losses of the first capacitive coupling structure 306-1 (e.g. TFMSL formed on or over a dielectric material) may be represented by the curve 1604 shown in FIG. 16A.

The first capacitive coupling structure 306-1 may include, or may be, a micro strip line (MSL). For example, the first capacitive coupling structure 306-1 (e.g. MSL) may include, or may be, a MSL formed on or over a laminate (e.g. a RO3003 laminate). In such an example, the frequency dependent losses of the first capacitive coupling structure 306-1 (e.g. MSL formed on or over a laminate) may be represented by the curve 1608 shown in FIG. 16A.

As shown in FIG. 16A, the insertion loss for the first capacitive coupling structure 306-1 (e.g. CPW) formed on or over the molding material indicated by curve 1606 may be comparable to the insertion loss for the first capacitive coupling structure 306-1 (e.g. TFMSL) formed on or over the dielectric material indicated by curve 1604.

FIG. 16B shows a graph 1601 which illustrates contributions of conductor losses (indicated by ac) and dielectric losses (indicated by $\alpha_D$) to the attenuation of the first capacitive coupling structure 306-1 (e.g. TFMSL), which may include, or may be, a TFMSL formed on or over a dielectric material (e.g. Benzocyclobutene (BCB)) (indicated by curve 1604). The contribution of conductor losses (indicated by $\alpha_C$) may be calculated as $R/2Z_0$, where $Z_0$ may be the characteristic impedance and where R may be the resistance. The contribution of dielectric losses (indicated by $\alpha_D$) may be calculated as $GZ_0/2$, where G may be the conductance per unit length.

As shown in FIG. 16B, the dielectric losses $\alpha_D$ may be smaller than the conductor losses $\alpha_C$. It is noted that the dielectric losses $\alpha_D$ may be further reduced with a use of low-loss thin-film dielectrics.

According to one or more aspects, the current disclosure proposes using a capacitive coupling between a chip and the radiating structure of an antenna, where an antenna coupling element (e.g. a coupling plate, e.g. a metal plate) may be integrated into a chip packaging structure (e.g. into a mold compound) that may encapsulate the chip.

According to one or more aspects, the current disclosure proposes a way that may avoid the use of PCB tracks, vias and/or soldering paste and the inherent material loss when coupling a chip to an antenna. Thus, it may be possible to reduce interconnection loss compared to conventional devices. According to one or more aspects, the cost and losses of a test connector (e.g. coaxial connector) may be avoided.

According to one or more aspects, the current disclosure proposes attaching the radiating structure of an antenna to a surface of the chip with, for example, a resilient structure, glue, or the like.

According to one or more aspects, the current disclosure proposes using a capacitive coupling as a test interface.

According to one or more aspects, the current disclosure proposes using a capacitive coupling test probe for connecting a chip to a test equipment.

According to one or more aspects, the current disclosure proposes connecting a chip to an antenna or test equipment via an antenna coupler plate that may be integrated into a chip packaging structure.

According to various examples described herein, a semiconductor device may be provided. The semiconductor device may include: a chip; a chip packaging structure at least partially surrounding the chip and having a receiving region configured to receive a first capacitive coupling structure; a first capacitive coupling structure disposed in the receiving region; and a second capacitive coupling structure disposed over the first capacitive coupling structure and capacitively coupled to the first capacitive coupling structure.

The first capacitive coupling structure may include, or may be, an antenna coupling element.

The first capacitive coupling structure may include, or may be, a coupling plate.

The first capacitive coupling structure may include, or may consist of, a metal or metal alloy.

The coupling plate may include, or may be, a metal plate.

The coupling plate may have a length in the range from about 0.5 mm to about 5 mm.

The coupling plate may have a width in the range from about 0.5 mm to about 5 mm.

The coupling plate may have a thickness in the range from about 0.1 mm to about 3 mm.

The second capacitive coupling structure may include, or may be, an antenna.

The second capacitive coupling structure may include, or may be, a coupling plate.

The coupling plate may include, or may consist of, a metal or metal alloy.

The coupling plate may include, or may be, a metal plate.

The coupling plate may have a length in the range from about 0.5 mm to about 5 mm.

The coupling plate may have a width in the range from about 0.5 mm to about 5 mm.

The coupling plate may have a thickness in the range from about 0.1 mm to about 3 mm.

The receiving region may include a side of the chip packaging structure facing the chip.

The first capacitive coupling structure may be attached to the side of the chip packaging structure facing the chip.

The side of the chip packaging structure may be an inner side of the chip packaging structure.

The semiconductor device may further include an air gap disposed between the chip and the first capacitive coupling structure.

The air gap may have a height in the range from about 1 mm to about 10 mm.

The receiving region may include a side of the chip packaging structure facing away from the chip.

The first capacitive coupling structure may be attached to the side of the chip packaging structure facing away from the chip.

The side of the chip packaging structure facing away from the chip may be an outer side of the chip packaging structure.

The first capacitive coupling structure may be at least partially embedded in the chip packaging structure.

The first capacitive coupling structure may be fully embedded in the chip packaging structure.

A portion of the chip packaging structure may be disposed between the first capacitive coupling structure and the second capacitive coupling structure.

The portion of the chip packaging structure may have a thickness in the range from about 0.1 mm to about 3 mm.

The second capacitive coupling structure may be attached to a second side of the chip packaging structure facing away from the chip.

The second capacitive coupling structure may be glued to the second side of the chip packaging structure.

The semiconductor device may further include a spring force element, wherein the second capacitive coupling structure may be attached to the second side of the chip packaging structure by means of the spring force element.

The second side of the chip packaging structure may be an outer side of the chip packaging structure.

The chip packaging structure may include, or may consist of, a material different from the chip.

The chip packaging structure may include, or may consist of, an insulating material.

The chip packaging structure may include, or may consist of, a chip packaging material.

The chip packaging structure may include, or may consist of, a molding material.

The semiconductor device may further include a dielectric layer disposed between the chip packaging structure and the second capacitive coupling structure.

The dielectric layer may include, or may consist of, a material different from the chip packaging structure.

The second capacitive coupling structure may include, or may be, a test probe.

The first capacitive coupling structure may be disposed over a back side of the chip.

The chip may include, or may be, a shielded chip.

The semiconductor device may further include a shielding structure disposed between the chip and the first capacitive coupling structure.

The shielding structure may include, or may consist of, a metal or metal alloy.

The shielding structure may include, or may be, a metallization layer.

The shielding structure may include, or may be, a redistribution layer.

The shielding structure may include, or may be, a back side metallization of the chip.

The shielding structure may be at least partially embedded in the chip packaging structure.

The chip may include at least one through-via electrically coupled to the shielding structure.

The semiconductor device may further include a dielectric layer disposed between the shielding structure and the first capacitive coupling structure.

The dielectric layer may include, or may be, a high-k dielectric material.

The dielectric layer may include, or may be, a ceramic layer at least partially embedded in the chip packaging structure.

The chip packaging structure may include or may be, a flip chip package.

The chip packaging structure may include, or may be, a wafer level package (WLP).

The chip packaging structure may include, or may be, an embedded wafer level ball grid array (eWLB) package.

The chip packaging structure may include an extension layer extending from at least one side of the chip.

The extension layer may include, or may consist of, a molding material.

The semiconductor device may further include at least one through-via electrically coupling the chip to the first capacitive coupling structure.

The extension layer may include at least one through-via electrically coupled to the shielding structure, and at least one through-via electrically coupling the first capacitive coupling structure to the chip.

The semiconductor device may further include a dielectric layer disposed between the first capacitive coupling structure and the second capacitive coupling structure.

The semiconductor device may further include an adhesive layer, wherein the second capacitive coupling structure may be attached to the first capacitive coupling structure by means of the adhesive layer.

The adhesive layer may include, or may be, a dry attach film.

The chip may include, or may be, at least one of the following: a transceiver; an amplifier; a tuner.

According to various examples described herein, a semiconductor device may be provided. The semiconductor device may include: a chip; a first capacitive coupling structure disposed over the chip and electrically coupled to the chip; a chip packaging structure at least partially surrounding the chip and the first capacitive coupling structure; and a second capacitive coupling structure disposed outside the chip packaging structure and capacitively coupled to the first capacitive coupling structure.

The first capacitive coupling structure may be at least partially embedded in the chip packaging structure.

The first capacitive coupling structure may be fully embedded in the chip packaging structure.

The first capacitive coupling structure may be attached to a first side of the chip packaging structure facing the chip.

The first side of the chip packaging structure may be an inner side of the chip packaging structure.

The semiconductor device may further include an air gap disposed between the first capacitive coupling structure and the chip.

The second capacitive coupling structure may be attached to a second side of the chip packaging structure facing away from the chip.

The second side of the chip packaging structure may be an outer side of the chip packaging structure.

The chip packaging structure may include, or may consist of, a molding material, e.g. a mold compound.

The first capacitive coupling structure may include, or may be an antenna coupler.

The second capacitive coupling structure may include, or may be, an antenna.

The second capacitive coupling structure may include, or may be, a test probe.

The chip may include, or may be, at least one of the following: a transceiver; an amplifier; a tuner.

According to various examples described herein, a semiconductor arrangement may be provided. The semiconductor arrangement may include: a first chip; a first chip packaging structure at least partially surrounding the first chip and having a first receiving region configured to receive a first antenna coupling element; a first antenna coupling element disposed in the first receiving region; a first antenna disposed over the first antenna coupling element and capacitively coupled to the first antenna coupling element; a second chip; a second chip packaging structure at least partially surrounding the second chip and having a second receiving region configured to receive a second antenna coupling element; a second antenna coupling element disposed in the second receiving region; a second antenna disposed over the second antenna coupling element and capacitively coupled to the second antenna coupling element; and a third chip electrically coupled to the first chip and the second chip.

The first chip may include, or may be, a first antenna tuner, and the second chip may include, or may be, a second antenna tuner.

The first antenna tuner may be configured to tune in to a first frequency or frequency band and the second antenna tuner may be configured to tune in to a second frequency or frequency band different from the first frequency or frequency band.

The third chip may include, or may be, at least one of the following: an amplifier; a duplexer; a transceiver; a base band circuit.

Various examples and aspects described in the context of one of the chip arrangements or chip packages or methods described herein may be analogously valid for the other chip arrangements or chip packages or methods described herein.

While various aspects have been particularly shown and described with reference to these aspects of this disclosure, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A semiconductor device, comprising:
   a chip;
   a chip packaging structure at least partially surrounding the chip and having a receiving region configured to receive a first capacitive coupling structure;
   a first capacitive coupling structure disposed in the receiving region; and
   a second capacitive coupling structure disposed over the first capacitive coupling structure and capacitively coupled to the first capacitive coupling structure, wherein the first capacitive coupling structure comprises an antenna coupling element and the second capacitive coupling structure comprises an antenna or a test probe.

2. The semiconductor device of claim 1, wherein the first capacitive coupling structure comprises a coupling plate.

3. The semiconductor device of claim 1, wherein the second capacitive coupling structure comprises a coupling plate.

4. The semiconductor device of claim 1, wherein the receiving region comprises a side of the chip packaging structure facing the chip.

5. The semiconductor device of claim 4, wherein the first capacitive coupling structure is attached to the side of the chip packaging structure facing the chip.

6. The semiconductor device of claim 4, further comprising an air gap disposed between the chip and the first capacitive coupling structure.

7. The semiconductor device of claim 1, wherein the receiving region comprises a second side of the chip packaging structure facing away from the chip.

8. The semiconductor device of claim 7, wherein the first capacitive coupling structure is attached to the second side of the chip packaging structure facing away from the chip.

9. The semiconductor device of claim 1, wherein the first capacitive coupling structure is at least partially embedded in the chip packaging structure.

10. The semiconductor device of claim 1, wherein a portion of the chip packaging structure is disposed between the first capacitive coupling structure and the second capacitive coupling structure.

11. The semiconductor device of claim 1, wherein the second capacitive coupling structure is attached to a second side of the chip packaging structure facing away from the chip.

12. The semiconductor device of claim 1, further comprising a shielding structure disposed between the chip and the first capacitive coupling structure.

13. The semiconductor device of claim 12, wherein the shielding structure comprises a metallization layer.

14. The semiconductor device of claim 12, wherein the shielding structure is at least partially embedded in the chip packaging structure.

15. The semiconductor device of claim 12, wherein the chip comprises at least one through-via electrically coupled to the shielding structure.

16. The semiconductor device of claim 12, further comprising a dielectric layer disposed between the shielding structure and the first capacitive coupling structure.

17. The semiconductor device of claim 16, wherein the dielectric layer comprises a high-k dielectric.

18. The semiconductor device of claim 1, wherein the chip packaging structure comprises an extension layer extending from at least one side of the chip.

19. The semiconductor device of claim 1, further comprising at least one through-via electrically coupling the chip to the first capacitive coupling structure.

20. The semiconductor device of claim 12, wherein the chip packaging structure comprises an extension layer extending from at least one side of the chip, wherein the extension layer comprises at least one through-via electrically coupled to the shielding structure, and at least one through-via electrically coupling the first capacitive coupling structure to the chip.

21. The semiconductor device of claim 1, further comprising a dielectric layer disposed between the first capacitive coupling structure and the second capacitive coupling structure.

22. A semiconductor device, comprising:
    a chip;
    a first capacitive coupling structure disposed over the chip and electrically coupled to the chip;
    a chip packaging structure at least partially surrounding the chip and the first capacitive coupling structure; and
    a second capacitive coupling structure disposed outside the chip packaging structure and capacitively coupled to the first capacitive coupling structure, wherein the first capacitive coupling structure comprises an antenna coupler and the second capacitive coupling structure comprises an antenna or a test probe.

23. The semiconductor device of claim 22, wherein the first capacitive coupling structure is at least partially embedded in the chip packaging structure.

24. A semiconductor arrangement, comprising:
    a first chip;
    a first chip packaging structure at least partially surrounding the first chip and having a first receiving region configured to receive a first antenna coupling element;

a first antenna coupling element disposed in the first receiving region;
a first antenna disposed over the first antenna coupling element and capacitively coupled to the first antenna coupling element;
a second chip;
a second chip packaging structure at least partially surrounding the second chip and having a second receiving region configured to receive a second antenna coupling element;
a second antenna coupling element disposed in the second receiving region;
a second antenna disposed over the second antenna coupling element and capacitively coupled to the second antenna coupling element; and
a third chip electrically coupled to the first chip and the second chip.

25. The semiconductor device of claim 24, wherein the first chip comprises a first antenna tuner, and wherein the second chip comprises a second antenna tuner.

26. The semiconductor device of claim 25, wherein the first antenna tuner is configured to tune in to a first frequency or frequency band and the second antenna tuner is configured to tune in to a second frequency or frequency band different from the first frequency or frequency band.

* * * * *